US010134935B2

(12) United States Patent
Nakai et al.

(10) Patent No.: US 10,134,935 B2
(45) Date of Patent: Nov. 20, 2018

(54) PHOTOELECTRIC CONVERSION APPARATUS AND PHOTOELECTRIC CONVERSION UNIT USED IN PHOTOELECTRIC CONVERSION APPARATUS

(71) Applicant: Panasonic Intellectual Property Management Co., Ltd., Osaka (JP)

(72) Inventors: Miyuki Nakai, Osaka (JP); Satoshi Shibata, Osaka (JP); Wataru Shinohara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 356 days.

(21) Appl. No.: 15/078,576

(22) Filed: Mar. 23, 2016

(65) Prior Publication Data

US 2016/0204293 A1 Jul. 14, 2016

Related U.S. Application Data

(63) Continuation of application No. PCT/JP2014/003593, filed on Jul. 7, 2014.

(30) Foreign Application Priority Data

Sep. 30, 2013 (JP) ................................ 2013-204790

(51) Int. Cl.
*H01M 10/44* (2006.01)
*H01L 31/042* (2014.01)
(Continued)

(52) U.S. Cl.
CPC ...... *H01L 31/053* (2014.12); *H01L 31/02008* (2013.01); *H01L 31/048* (2013.01);
(Continued)

(58) Field of Classification Search
CPC ..... H01L 31/053; H01L 31/048; H02S 40/38; H02J 7/35; Y02E 10/50
(Continued)

(56) References Cited

U.S. PATENT DOCUMENTS 6,232,655 B1 * 5/2001 Sugimura ............ H01L 23/482 257/690
7,179,527 B2 * 2/2007 Sato .................... C23C 16/0272 136/255
(Continued)

FOREIGN PATENT DOCUMENTS

JP 58-133945 U 9/1983
JP 59-006853 U 1/1984
(Continued)

OTHER PUBLICATIONS

International Search Report for corresponding International Application No. PCT/JP2014/003593 dated Aug. 12, 2014.

*Primary Examiner* — M'Baye Diao
(74) *Attorney, Agent, or Firm* — Renner Otto Boisselle & Sklar, LLP

(57) ABSTRACT

In an embodiment, photoelectric conversion units (10) each include a package (12) accommodating a photoelectric conversion device (11). The package (12) has a front surface (12*a*) having a window (13); and a side surface (12*c*). The package (12) includes a first coupling portion (14) protruding from the side surface (12*c*) in a first direction X parallel to a light incident surface (11*a*) of the photoelectric conversion device (11), and a second coupling portion (15) recessed from the side surface (12*c*) in the first direction X. The first coupling portion (14) includes a first terminal (16) electrically connected with the photoelectric conversion device (11), and the second coupling portion (15) includes a second terminal (17) electrically connected with the photoelectric conversion device (11). The first coupling portion
(Continued)

(14) and the second coupling portion (15) have shapes and sizes matching each other, and are coupled with each other by fitting.

16 Claims, 25 Drawing Sheets

(51) Int. Cl.

| | |
|---|---|
| ***H01L 31/053*** | (2014.01) |
| ***H02S 40/38*** | (2014.01) |
| ***H02J 7/35*** | (2006.01) |
| ***H02S 40/36*** | (2014.01) |
| ***H01L 31/02*** | (2006.01) |
| ***H01L 31/048*** | (2014.01) |
| ***H01L 31/05*** | (2014.01) |

(52) U.S. Cl.
CPC ............ *H01L 31/0504* (2013.01); *H02J 7/35* (2013.01); *H02S 40/36* (2014.12); *H02S 40/38* (2014.12); *Y02E 10/50* (2013.01)

(58) Field of Classification Search
USPC ........................................... 320/101; 136/244
See application file for complete search history.

(56) References Cited

U.S. PATENT DOCUMENTS 8,507,310 B2 * 8/2013 Tokioka .......... H01L 31/022425 136/244
8,884,391 B2 * 11/2014 Fudaba ............... H01L 31/0236 257/432
9,087,950 B2 * 7/2015 Yamazaki ................. B60T 1/10
9,413,289 B2 * 8/2016 Ito ........................... H02S 40/32
2009/0293934 A1 * 12/2009 Okada ............... H01L 31/02168 136/246
2010/0180925 A1 * 7/2010 Nasuno ............. H01L 31/02021 136/244
2010/0307559 A1 * 12/2010 Yamazaki ............. H01L 31/048 136/244
2011/0315187 A1 * 12/2011 Wada .................... H01L 31/048 136/244
2012/0047386 A1 2/2012 Matsui
2015/0048317 A1 * 2/2015 Sasaki ............... H01L 27/14625 257/40

FOREIGN PATENT DOCUMENTS

| | | | |
|---|---|---|---|
| JP | 03-036156 | U | 4/1991 |
| JP | 2001-216950 | A | 8/2001 |
| JP | 2003-059464 | A | 2/2003 |
| JP | 2009-081160 | A | 4/2009 |
| JP | 2011-008967 | A | 1/2011 |
| JP | 2011-071053 | A | 4/2011 |
| JP | 2012-178472 | A | 9/2012 |
| JP | 2013-069437 | A | 4/2013 |
| JP | 2013-080885 | A | 5/2013 |
| WO | WO 2008/073905 | A2 | 6/2008 |
| WO | WO 2010/019742 | A1 | 2/2010 |
| WO | WO 2010/125878 | A1 | 11/2010 |

* cited by examiner

PHOTOELECTRIC CONVERSION APPARATUS AND PHOTOELECTRIC CONVERSION UNIT USED IN PHOTOELECTRIC CONVERSION APPARATUS

This is a continuation of International Application No. PCT/JP2014/003593, with an international filing date of Jul. 7, 2014, which claims priority of Japanese Patent Application No. 2013-204790, filed on Sep. 30, 2013, the contents of which are hereby incorporated by reference.

BACKGROUND

Technical Field

The present application relates to a photoelectric conversion unit including a photoelectric conversion device, and a photoelectric conversion apparatus including a plurality of such photoelectric conversion units.

Related Art

Japanese Laid-Open Patent Publication No. 2003-59464 describes a structure in which a plurality of thin batteries are connected with each other. In this structure, flanges of the plurality of batteries are connected with each other by welding.

Japanese Laid-Open Patent Publication No. 2011-71053 discloses a battery pack in which a plurality of flat rectangular batteries are stacked such that wide surfaces thereof face each other. In this structure, the plurality of batteries are mechanically connected with each other by terminal connection portions thereof each having a concaved and convexed shape.

SUMMARY

Conventionally, an apparatus capable of connecting a plurality of photoelectric conversion devices with each other so as to be mechanically and electrically detachable from each other at a high level of freedom is not known.

An embodiment according to the present disclosure provides a photoelectric conversion unit capable of connecting a plurality of photoelectric conversion devices with each other so as to be mechanically and electrically detachable from each other at a high level of freedom and also provides a photoelectric conversion apparatus including a plurality of such photoelectric conversion units.

In one general aspect, a photoelectric conversion apparatus disclosed herein is a photoelectric conversion apparatus including a plurality of photoelectric conversion units located in an array. Each of the photoelectric conversion units includes at least one photoelectric conversion device having a light incident surface; and a package accommodating the photoelectric conversion device and allowing light to be incident on the light incident surface of the photoelectric conversion device accommodated therein. The package includes a front surface having a window transmitting light; a rear surface; a side surface between the front surface and the rear surface; a first coupling portion protruding from the side surface in a first direction parallel to the light incident surface of the accommodated photoelectric conversion device, the first coupling portion including a first terminal of a first polarity that is electrically connected with the photoelectric conversion device; and a second coupling portion recessed from the side surface in the first direction, the second coupling portion including a second terminal of a second polarity that is electrically connected with the photoelectric conversion device, the second polarity being opposite to the first polarity. The plurality of photoelectric conversion devices are electrically connected with each other via the first terminal and the second terminal. The photoelectric conversion device includes a photoelectric conversion portion and an electric power storage unit electrically connected with the photoelectric conversion portion.

In another aspect, a photoelectric conversion unit disclosed herein includes at least one photoelectric conversion device having a light incident surface; and a package accommodating the photoelectric conversion device and allowing light to be incident on the light incident surface of the photoelectric conversion device accommodated therein. The package includes a front surface having a window transmitting light; a rear surface; a side surface between the front surface and the rear surface; a first coupling portion protruding from the side surface in a first direction parallel to the light incident surface of the accommodated photoelectric conversion device, the first coupling portion including a first terminal of a first polarity that is electrically connected with the photoelectric conversion device; and a second coupling portion recessed from the side surface in the first direction, the second coupling portion including a second terminal of a second polarity that is electrically connected with the photoelectric conversion device, the second polarity being opposite to the first polarity. The photoelectric conversion device includes a photoelectric conversion portion and an electric power storage unit electrically connected with the photoelectric conversion portion In another aspect, a method for assembling a photoelectric conversion apparatus disclosed herein includes preparing the first and second photoelectric conversion units having the above-described structure; and coupling the first coupling portion of the first photoelectric conversion unit and the second coupling portion of the second photoelectric conversion unit with each other.

In another aspect, a method for charging a photoelectric conversion apparatus disclosed herein includes preparing the above-described photoelectric conversion apparatus; and irradiating the photoelectric conversion apparatus with light to generate power in the photoelectric conversion portion of the photoelectric conversion device and charging the electric power storage portion of the photoelectric conversion device with the power.

According to an embodiment of the present disclosure, a plurality of photoelectric conversion devices may be connected with each other so as to be mechanically and electrically detachable from each other at a higher degree of freedom to produce a photoelectric conversion apparatus.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Figure 1A:
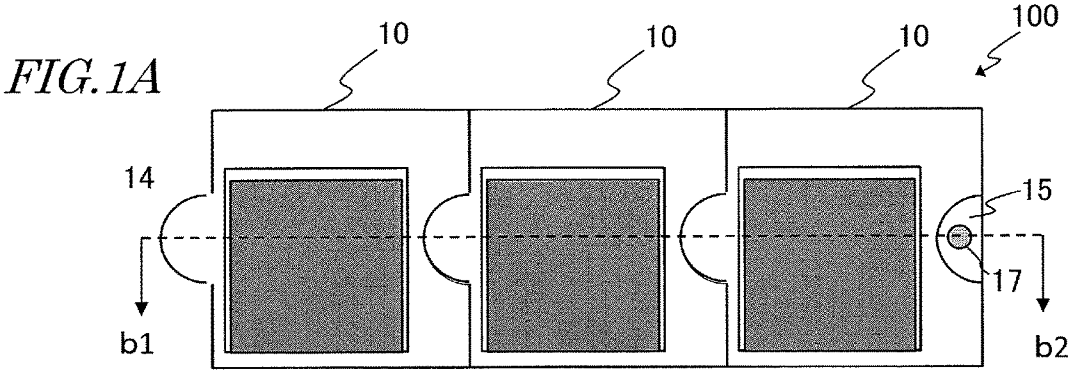
FIG. 1A is a plan view of a photoelectric conversion apparatus 100.

First, with reference to FIGS. 1A to 1D, a non-limiting example of structure of a photoelectric conversion apparatus according to the present disclosure will be described. FIG. 1A is a plan view of a photoelectric conversion apparatus 100, FIG. 1B is a cross-sectional view thereof taken along line b1-b2 shown in FIG. 1A, FIG. 1C is a plan view of a photoelectric conversion unit 10 included in the photoelectric conversion apparatus 100, and FIG. 1D is a cross-sectional view thereof taken along line d1-d2 shown in FIG. 1C.

Figure 1B:
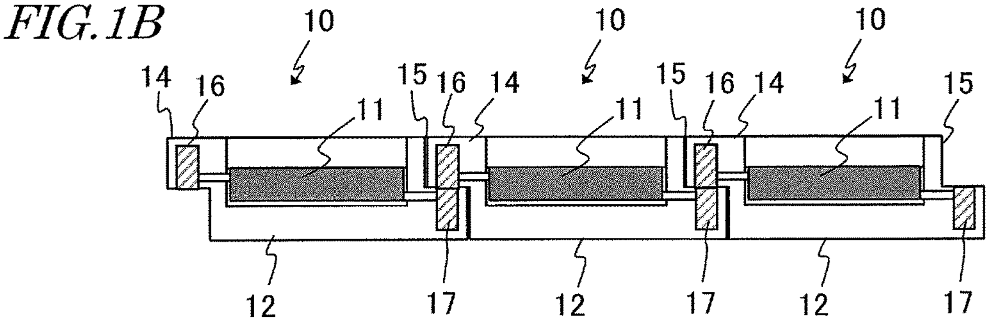
FIG. 1B is a cross-sectional view of FIG. 1A taken along line b1-b2.
Figure 1C:
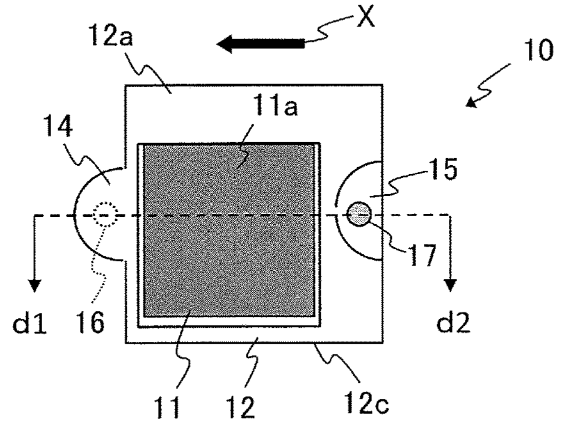
FIG. 1C is a plan view of a photoelectric conversion unit 10 included in the photoelectric conversion apparatus 100.
Figure 1D:
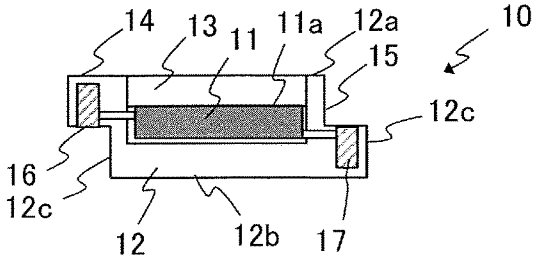
FIG. 1D is cross-sectional view of FIG. 1C taken along line d1-d2.

The photoelectric conversion apparatus 100 shown in FIG. 1A and FIG. 1B includes a plurality of the photoelectric conversion units 10 arrayed on the same flat plane. In this example, three photoelectric conversion units 10 are arrayed in one line. The number of the photoelectric conversion units included in one photoelectric conversion apparatus 100 is not limited to three, and may be two, or four or more. The plurality of photoelectric conversion units 10 do not need to be arrayed in one line, and may be arrayed in rows and columns on a flat plane or a curved plane.

Now, with reference to FIG. 1C and FIG. 1D, an example of structure of the photoelectric conversion unit 10 will be described. Each of the photoelectric conversion units 10 includes at least one photoelectric conversion device 11 having a light incident surface 11*a*, and a package 12 accommodating the photoelectric conversion device 11. The light incident surface 11*a* expands generally in a flat plane, but may have a raised portion and/or a recessed portion.

The photoelectric conversion device 11 has a function and a structure of converting light incident on the light incident surface 11*a* into an electric energy. Such a device may typically be a composite device including a solar photovoltaic cell and a secondary battery (rechargeable battery) in combination. Such a composite device can charge a storage battery with electricity generated by the solar photovoltaic cell. The solar photovoltaic cell may be realized with an inorganic semiconductor or an organic semiconductor, and may operate by dye sensitization. The secondary battery may typically be a battery having a solid-state electrolyte, but may have any other structure. The photoelectric conversion device 11 may include a circuit element or an internal circuit such as a diode, a capacitor, a switch or the like. The photoelectric conversion device 11 may include an interface that is structured to perform data exchange with a controller (not shown) or any other electronic device in a wired or wireless manner. In addition, in the case of including an electric power storage unit, the photoelectric conversion device 11 may include an accessory device such as a charge/discharge circuit, an LED (light emitting diode) showing a charged state, or the like.

The package 12 is structured to allow light to be incident on the light incident surface 11*a* of the photoelectric conversion device 11 accommodated therein. The package 12 has a front surface 12*a* having a window 13 transmitting light, a rear surface 12*b*, and a side surface 12*c* between the front surface 12*a* and the rear surface 12*b*. The window 13 may be a simple opening having a function of transmitting light, or may be a light-transmissive member formed of glass or a plastic material. The package 12 may typically be formed of an insulating material such as a resin or the like, for example, an epoxy resin that is especially highly damp-proof among epoxy resins generally used in, for example, semiconductor devices, an EVA resin (ethylene-vinyl acetate copolymer) used for solar batteries, a laminate material containing a PET resin or the like, glass or the like. The package 12 may partially include a metal member or a non-metal conductive member for electrical or mechanical connection. The package 12 may also include a metal member for releasing heat or preventing dampness.

The package shown here is generally thin and parallelepiped, but the package 12 is not limited to having such a general shape.

The package 12 in a non-limiting embodiment according to the present disclosure includes a first coupling portion 14 protruding from the side surface 12*c* in a first direction X parallel to the light incident surface 11*a* of the photoelectric conversion device 11, and a second coupling portion 15 recessed from the side surface 12*c* in the first direction X. The first coupling portion 14 includes a first terminal 16 electrically connected with the photoelectric conversion device 11, and the second coupling portion 15 includes a second terminal 17 electrically connected with the photoelectric conversion device 11. The first terminal 16 and the second terminal 17 have polarities opposite to each other. In other words, the polarity of the first terminal 16 is one of "positive" and "negative", whereas the polarity of the second terminal 17 is the other of "positive" and "negative". The polarities of the first terminal 16 and the second terminal 17 are determined based on the state of connection between the photoelectric conversion device 11 and the terminals 16 and 17.

The power generated by each photoelectric conversion device 11, or the power accumulated in the photoelectric conversion device 11, may be taken out to the outside of the photoelectric conversion unit 10 via the pair of terminals 16 and 17 of the package 12. In the example shown in FIG. 1A and FIG. 1B, when the first terminal 16 of the first coupling portion 14 of the photoelectric conversion unit 10 located at the left end in the figures, among the three photoelectric conversion units 10 coupled with each other, and the second terminal 17 of the second coupling portion 15 of the photoelectric conversion unit 10 located at the right end in the figures, are electrically connected with an external circuit (not shown), the power may be supplied from the photoelectric conversion apparatus 100 to the external circuit.

The first coupling portion 14 and the second coupling portion 15 have shapes and sizes matching each other. The first coupling portion 14 and the second coupling portion 15 respectively correspond to a protruding portion and a recessed portion of a piece of a jigsaw puzzle. As shown in FIG. 1A and FIG. 1B, the first coupling portion 14, having a protruding shape, of one photoelectric conversion unit 10 fits into the second coupling portion 15, having a recessed shape, of the photoelectric conversion unit 10 adjacent to the one photoelectric conversion unit 10. Such fitting allows two adjacent photoelectric conversion units 10 to be coupled with each other mechanically or physically. In the state where the photoelectric conversion units 10 are coupled with each other in this manner, as shown in FIG. 1B, a bottom surface of the first terminal 16 of the first coupling portion 14 and a top surface of the second terminal 17 of the second coupling portion 15 are in contact with each other. This also realizes electrical series connection. In the example shown in the figures, a surface of the first coupling portion 14 on the side of the rear surface and a surface of the second coupling portion 15 on the side of the front surface are located substantially at the same plane. The number of the photoelectric conversion units 10 connected in series may be any number. For example, in the case where one photoelectric conversion unit 10 generates a voltage of Va volts and an external device requires a voltage of Vt volts, the photoelectric conversion units 10 in the number of N, which fulfills $N \times Va \geq Vt$, may be connected in series. In the case where a voltage boost circuit or a voltage drop circuit is added, the number of the photoelectric conversion units 10 may be any number.

The size of the first coupling portion 14 having a protruding shape and the size of the second coupling portion 15 having a recessed shape may be appropriately selected in accordance with the strength of the material. In this embodiment, theses coupling portions may be set to protrude and to be recessed in the first direction X from the side surface 12*c* by a distance in the range of, for example, about 1 mm to about 10 mm. The bottom surface of the first terminal 16 and the top surface of the second terminal 17 may each be set to have an area size in the range of, for example, about 0.5 $mm^2$ to about 30 $mm^2$. Such a size may be changed to be of a larger value in the case where the photoelectric conversion units 10 are of a large size (e.g., having a side that is 10 cm or longer).

In an embodiment in which a user presses one photoelectric conversion unit 10 to another photoelectric conversion unit 10 to fit the first coupling portion 14 into the second coupling portion 15, at least portions of the package 12 that include the coupling portions 14 and 15 have a sufficiently high level of mechanical rigidity and a necessary level of elasticity.

The first coupling portion 14 and the second coupling portion 15 do not need to be coupled with each other via fitting. Any other known structure which allows the first coupling portion 14 and the second coupling portion 15 to be attached to, or detached from, each other by the user may be used. For example, magnets of different polarities may be secured to the first coupling portion 14 and the second coupling portion 15, so that the first coupling portion 14 and the second coupling portion 15 may be coupled with each other by a magnetic force.

In the example shown in the figures, one package 12 includes one first coupling portion 14 and one second coupling portion 15. Alternatively, one package 12 may include a plurality of first coupling portions 14 and a plurality of second coupling portions 15. The first coupling portion 14 and the second coupling portion 15 are not limited to having the shape or the size shown in the figures. The first coupling portion 14 and the second coupling portion 15 may each have a more complicated shape, for example, a shape including a protruding portion and a recessed portion. Alternatively, the package 12 may include a third coupling portion protruding in a second direction crossing the first direction X and a fourth coupling portion recessed in the second direction.

Each photoelectric conversion unit 10 may independently generate power by the photoelectric conversion device 11 included therein and output the power via the first and second terminals 16 and 17. In the photoelectric conversion apparatus 100 in a non-limiting embodiment according to the present disclosure, the plurality of photoelectric conversion units 10 are coupled with each other mechanically or physically and are also connected with each other electrically. As a result, in the photoelectric conversion apparatus 100, a plurality of photoelectric conversion devices 11 may be electrically connected in series or in parallel via the first and second terminals 16 and 17. However, the coupling of the photoelectric conversion units 10 in the photoelectric conversion apparatus 100 is not permanent. The photoelectric conversion apparatus 100 is structured to allow any photoelectric conversion unit 10 to be detached by the user. As described later in detail, the photoelectric conversion unit 10 detached from the photoelectric conversion apparatus 100 may be connected with another electronic device and used to charge the electronic device. A photoelectric conversion unit 10, when malfunctions, may be replaced with another photoelectric conversion unit 10 that operates normally.

Hereinafter, embodiments according to the present disclosure will be described in more detail with reference to the drawings. In the embodiments, elements having substantially the same structure as those of the embodiment (s) described previously will bear the same reference signs, and detailed descriptions thereof may be omitted. The present disclosure is not limited to any of the following embodiments.

Embodiment 1

<Structure of a Photoelectric Conversion Unit>

Figure 2A:
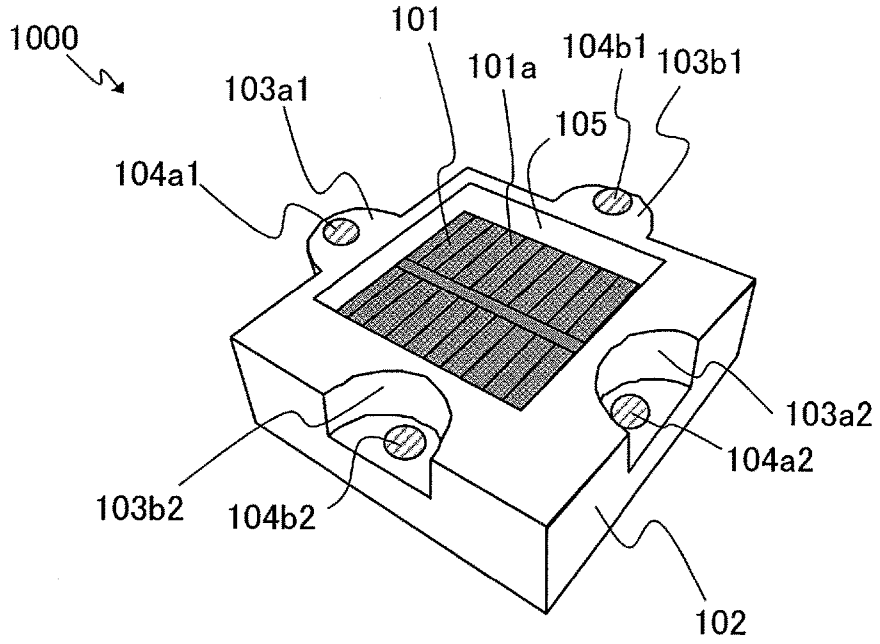
FIG. 2A is a schematic isometric view of a photoelectric conversion unit in an embodiment according to the present disclosure.

FIG. 2A is an isometric view showing a structure of a photoelectric conversion unit 1000 in embodiment 1 according to the present disclosure.

As shown in FIG. 2A, the photoelectric conversion unit 1000 includes a photoelectric conversion device 101 and a package 102 accommodating the photoelectric conversion device 101. Hereinafter, the photoelectric conversion device 101 may be referred to simply as the “device”.

The device 101 has a light incident surface, which is a surface of a photoelectric conversion portion 101*a*. Light incident on the light incident surface is converted into an electric energy by the photoelectric conversion portion 101*a* to generate a voltage. The photoelectric conversion portion 101*a* includes, for example, striped electrodes, a positive electrode line and a negative electrode line. In this embodiment, the photoelectric conversion portion 101*a* is, for example, a solar photovoltaic cell formed of silicon. The side of the photoelectric conversion unit 1000 at which the light incident surface is provided will be referred to as the “front surface side”, whereas the opposite side will be referred to as the “rear surface side”.

The package 102 shown in the figure is generally parallelepiped, and includes a recessed portion in a part thereof on the front surface side. In the recessed portion, the device 101 is accommodated. It should be noted that the package 102 may have any of various shapes. In this specification, a surface of the package 102 on the front surface side will be referred to as a “front surface”, a surface thereof on the rear surface side will be referred to as a “rear surface”, and a surface between the front surface and the rear surface will be referred to as a “side surface”.

The package 102 includes a first protruding coupling portion 103*a*1, a first recessed coupling portion 103*a*2, a second protruding coupling portion 103*b*1 and a second recessed coupling portion 103*b*2. The first protruding coupling portion 103*a*1, the first recessed coupling portion 103*a*2, the second protruding coupling portion 103*b*1 and the second recessed coupling portion 103*b*2 respectively act as a first coupling portion, a second coupling portion, a third coupling portion and a fourth coupling portion of the present disclosure.

The first protruding coupling portion 103*a*1 has such a shape and such a size as to fit into, and thus as to be coupled with, the first recessed coupling portion 103*a*2. In this embodiment, the shape and the size of the first protruding coupling portion 103*a*1 and the shape and the size of the first recessed coupling portion 103*a*2 are substantially the same as each other except that one portion is protruding and the other portion is recessed. Similarly, the second protruding coupling portion 103*b*1 has such a shape and such a size as to fit into, and thus as to be coupled with, the second recessed coupling portion 103*b*2. In this embodiment, the shape and the size of the second protruding coupling portion 103*b*1 and the shape and the size of the second recessed coupling portion 103*b*2 are also substantially the same as each other. The shape and the size of the first protruding coupling portion 103*a*1 and the shape and the size of the second protruding coupling portion 103*b*1 do not need to be the same as each other, but may be the same or may be different for some purpose.

Figure 2B:
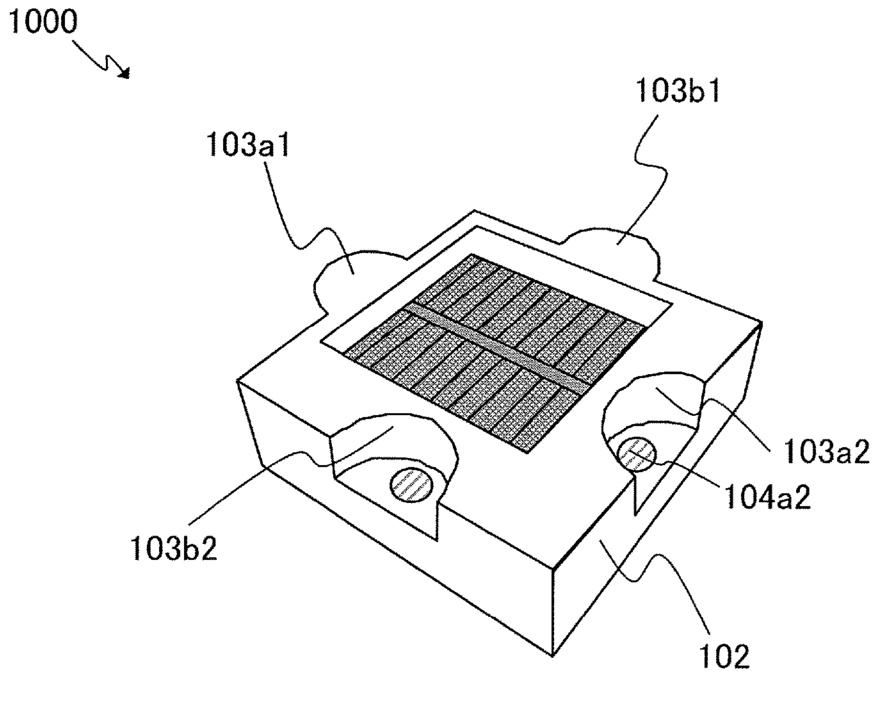
FIG. 2B is an isometric view showing an external view of the photoelectric conversion unit in the embodiment according to the present disclosure.

The first protruding coupling portion 103*a*1 includes a positive electrode terminal 104*a*1 formed therein. The positive electrode terminal 104*a*1 is electrically connected with the positive electrode line of the device 101. A front surface of the positive electrode terminal 104*a*1 on the front surface side is shown as being exposed outside in FIG. 2A, but in actuality, is not exposed as shown in FIG. 2B. In this embodiment, the front surface of the positive electrode terminal 104*a*1 is covered with a material forming the package 102, typically, a resin. A rear surface of the positive electrode terminal 104*a*1 on the rear surface side is exposed for electrical connection. This will be described later with reference to FIG. 3, which shows a cross-sectional structure.

The first recessed coupling portion 103*a*2 includes a negative electrode terminal 104*a*2 formed therein. The negative electrode terminal 104*a*2 is electrically connected with the negative electrode line of the device 101. A front surface of the negative electrode terminal 104*a*2 on the front surface side is exposed outside as shown in FIG. 2A. In actuality, the front surface of the negative electrode terminal 104*a*2 is exposed outside, whereas a rear surface thereof on the rear surface side is not exposed. The rear surface of the negative electrode terminal 104*a*2 is covered with a material forming the package 102, typically, a resin. The front surface of the negative electrode terminal 104*a*2 is exposed for electrical connection. This will be described later with reference to FIG. 3.

In the example shown in FIG. 2A, the package 102 has a window which transmits light to the light incident surface 101*a* of the device 101. The window is provided with a glass member 105. The glass member 105 has a role of protecting the device 101 from external moisture or the like and also has a role of allowing light to be incident on the light incident surface 101*a*. The window may be provided with a transparent member of, for example, an acrylic resin or the like instead of the glass member 105.

As shown in FIG. 2A, the package 102 includes the second protruding coupling portion 103*b*1 and the second recessed coupling portion 103*b*2. The second protruding coupling portion 103*b*1 includes a terminal 104*b*1 formed therein, whereas the second recessed coupling portion 103*b*2 includes a terminal 104*b*2 formed therein. In this embodiment, the terminals 104*b*1 and 104*b*2 provided in the package 102 in advance are not electrically connected with the device 101 accommodated in the package 102. In this example, a cross-section crossing a pair of terminals 104*a*1 and 104*a*2 (vertical to the light incident surface) is perpendicular to a cross-section crossing another pair of terminals 104*b*1 and 104*b*2 (vertical to the light incident surface).

One package 102 includes the fourth terminals 104*a*1, 104*a*2, 104*b*1 and 104*b*2. This allows a plurality of the photoelectric conversion units 1000 to be electrically connected mutually in any of various forms at a higher level of freedom. For accommodating two devices 101 in one package 102, one of the devices 101 may be connected with the pair of terminals 104*a*1 and 104*a*2, whereas the other of the devices 101 may be connected with the pair of terminals 104*b*1 and 104*b*2.

The photoelectric conversion unit 1000 does not need to include the terminals 104*b*1 and 104*b*2 as indispensable elements. An embodiment in which neither terminal 104*b*1 nor the terminal 104*b*2 is provided will be described later with reference to FIG. 9.

<Package>

Figure 2C:
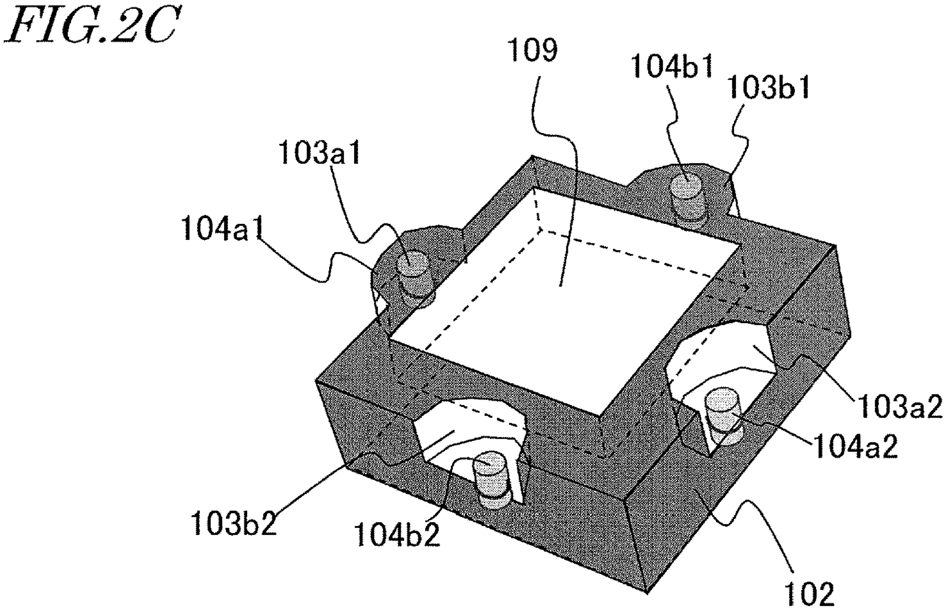
FIG. 2C is an isometric view of a package in the embodiment according to the present disclosure.

FIG. 2C schematically shows a structure of the package 102 with the device 101 being removed from the photoelectric conversion unit 1000 shown in FIG. 2A. The package 102 includes a device accommodation portion 109 formed at a center thereof. A width of an opening of the device accommodation portion 109, namely, an area size of the window of the package 102, is substantially equal to the width (area size) of a surface (light incident surface) of the photoelectric conversion portion 101*a* of the device 101. A depth of the device accommodation portion 109 is substantially equal to, or larger than, a total of a thickness of the device 101 and a thickness of the glass member 105 located on the device 101.

FIG. 2C schematically shows the positive electrode terminal 104*a*1, the negative electrode terminal 104*a*2, the terminal 104*b*1 and the terminal 104*b*2 in the state of being embedded in the package 102 so as to be partially exposed (such that contact surfaces thereof are exposed) at the first protruding coupling portion 103*a*1, the first recessed coupling portion 103*a*2, the second protruding coupling portion 103*b*1 and the second recessed coupling portion 103*b*2.

<Photoelectric Conversion Device>

Figure 2D:
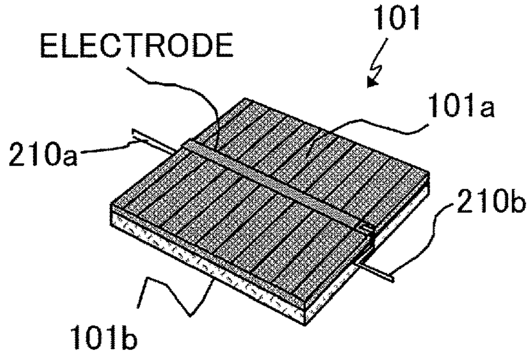
FIG. 2D is an isometric view of a photoelectric conversion device in the embodiment according to the present disclosure.

FIG. 2D is an isometric view showing an example of structure of the device 101. At a front surface of the device 101 (on the front surface side of the package 102), the photoelectric conversion portion 101*a* is formed. On a rear surface of the photoelectric conversion portion 101*a* on the rear surface side, an electric power storage portion 101*b* is formed. In this embodiment, the electric power storage portion 101*b* is a thin storage battery using a solid-state electrolyte. A structure, and a method for producing, a device including the photoelectric conversion portion and the electric power storage portion in an integrated manner (solar secondary battery) is disclosed in, for example, WO2014/013637. A positive electrode line (first connection line) 210*a* and a negative electrode line (second connection line) 210*b* extend from the device 101 to be connectable with an external electrode.

Figure 2E:
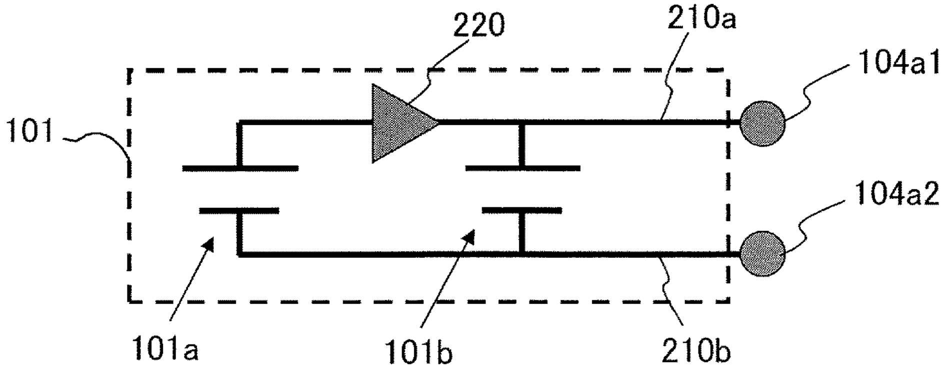
FIG. 2E is an equivalent circuit diagram of the photoelectric conversion device in the embodiment according to the present disclosure.

FIG. 2E is an equivalent circuit diagram of the device 101. A positive electrode of the photoelectric conversion portion 101*a* and a positive electrode of the electric power storage portion 101*b* are electrically connected with each other and are connected with the positive electrode terminal 104*a*1. A negative electrode of the photoelectric conversion portion 101*a* and a negative electrode of the electric power storage portion 101*b* are electrically connected with each other and are connected with the negative electrode terminal 104*a*2.

In this embodiment, a diode 220 is provided so as not to allow charges accumulated in the electric power storage portion 101*b* from flowing to the photoelectric conversion portion 101*a*. When the light is not incident, the electromotive force of the photoelectric conversion portion 101*a* is decreased, and therefore the voltage of the electric power storage portion 101*b* may possibly exceed the electromotive force of the photoelectric conversion portion 101*a*. In such a case, if the diode 220 is not provided, an electric current flows from the electric power storage portion 101*b* to the photoelectric conversion portion 101*a*, and as a result, the power accumulated in the electric power storage portion 101*b* is consumed (discharged). In this embodiment, in order to prevent such discharge, the diode (rectification portion) 220 is provided as shown in FIG. 2E, so that a reverse current from the electric power storage portion 101*b* to the photoelectric conversion portion 101*a* is prevented.

At a rear surface of the device 101 on the rear surface side, the electric power storage portion 101*b* is formed. The electric power storage portion 101*b* does not need to be formed. Merely the photoelectric conversion portion 101*a* may be formed at the front surface of the device 101.

<Detailed Structure of the Photoelectric Conversion Unit>

Figure 3A:
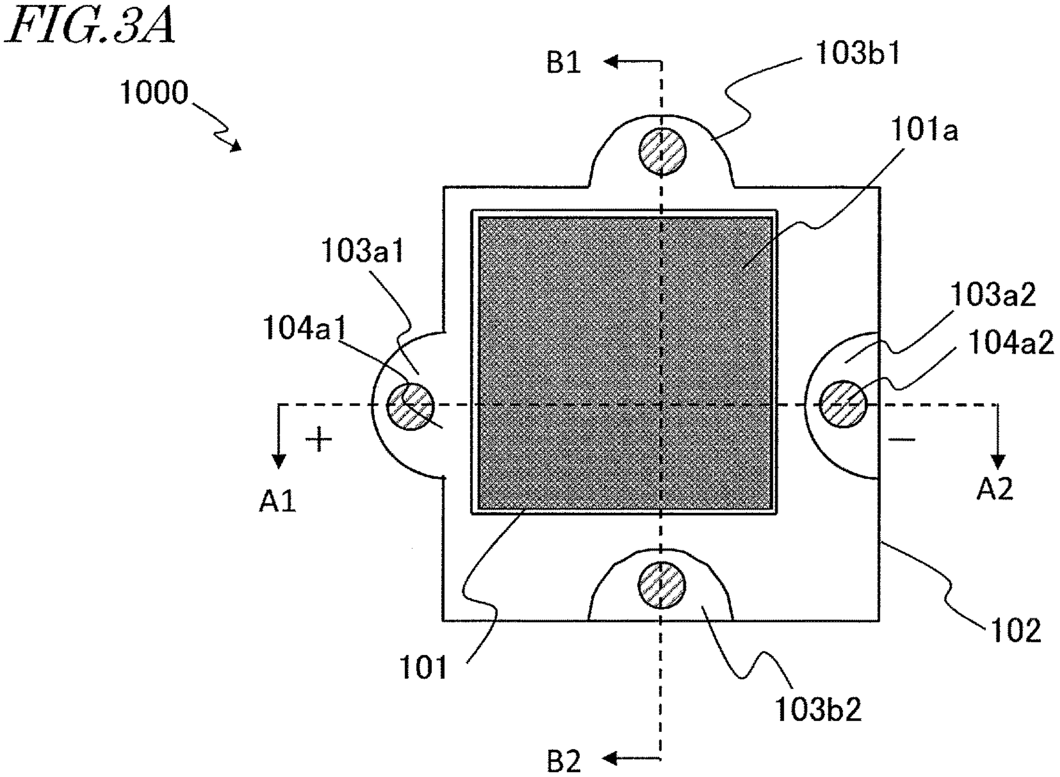
FIG. 3A is a plan view of the photoelectric conversion unit in the embodiment according to the present disclosure.
Figure 3B:
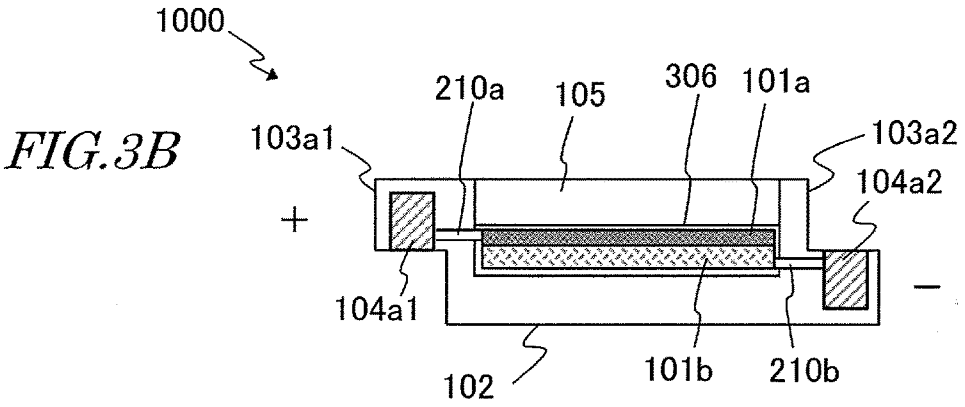
FIG. 3B is a cross-sectional view of FIG. 3A, taken along line A1-A2.
Figure 3C:
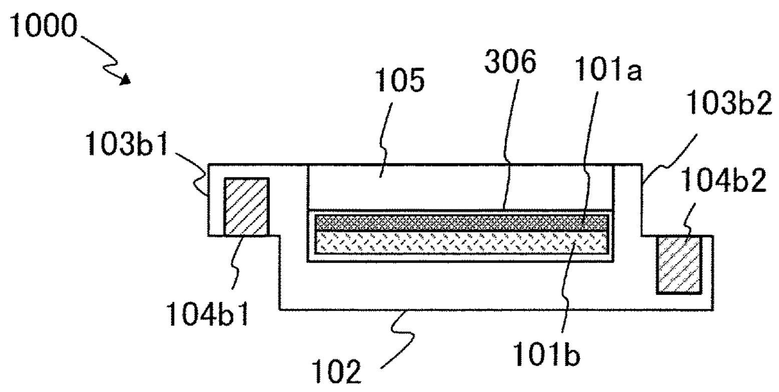
FIG. 3C is a cross-sectional view of FIG. 3A taken along line B1-B2.

With reference to FIG. 3, a structure of the photoelectric conversion unit 1000 will be described. FIG. 3A is a plan view of the photoelectric conversion unit 1000. FIG. 3B is a cross-sectional view of the photoelectric conversion unit 1000 taken along line A1-A2, and FIG. 3C is a cross-sectional view of the photoelectric conversion unit 1000 taken along line B1-B2. In FIG. 3A, the electrodes of the device 101 are omitted.

The package 102 in this embodiment is formed of a resin. As shown in FIG. 3B, the front surface of the terminal 104*a*1 of the +polarity is covered with a resin, whereas the rear surface thereof is not covered with a resin and is exposed. By contrast, the rear surface of the terminal 104*a*2 of the −polarity is covered with a resin, whereas the front surface thereof is not covered with a resin and is exposed. Because of this, the rear surface of the terminal 104*a*1 of the +polarity of one photoelectric conversion unit 1000 and the front surface of the terminal 104*a*2 of the −polarity of another photoelectric conversion unit 1000 are allowed to face, and to be in contact with, each other. This allows such two adjacent photoelectric conversion units 1000 to be electrically connected with each other (see FIG. 1B).

In the example shown in FIG. 3B and FIG. 3C, the device 101 is entirely covered with a light-transmissive and air-tight resin 306. The light-transmissive and air-tight resin 306 protects the device 101. The light-transmissive and air-tight resin 306 is not indispensable, and the device 101 does not need to be protected by the resin 306.

As is clear from FIG. 3A through FIG. 3C, the first protruding coupling portion 103*a*1 of the package 102 protrudes laterally outside from the side surface of a main body of the package 102. The protruding portion is coupled with the first recessed coupling portion 103*a*2 of another package 102. The first recessed coupling portion 103*a*2 has such a shape that the first protruding coupling portion 103*a*1 closely fits into the first recessed coupling portion 103*a*2.

As shown in FIG. 3A, in the state where the package 102 is seen in a direction normal to the front surface thereof, the first recessed coupling portion 103*a*2 is recessed inward from an outer edge of the package 102 by an area size equal to that of a top surface of the first protruding coupling portion 103*a*1. This allows the first protruding coupling portion 103*a*1 to closely fit into, and thus to be coupled with, the first recessed coupling portion 103*a*2. Similarly, the second recessed coupling portion 103*b*2 is recessed inward from the outer edge of the package 102 by an area size equal to that of a top surface of the second protruding coupling portion 103*b*2. This allows the second protruding coupling portion 103*b*1 to closely fit into, and thus to be coupled with, the second recessed coupling portion 103*b*2. The device 101 is not located at the center of the package 102, and the center of the device 101 is shifted to the top left side in the figure from the center of the package 102. The device 101 is located at such a position in order to allow the photoelectric conversion portion 101*a* of the device 101 to have as large an area size as possible.

In the photoelectric conversion unit 1000 in this embodiment, the electricity flows in a direction of line A1-A2 in FIG. 3A. As shown in FIG. 3B, the positive electrode line 210*a* and the negative electrode line 210*b* are located at different positions in a height direction. In other words, a distance from an arbitrary plane parallel to the light incident surface to the positive electrode line 210*a* and a distance from the plane to the negative electrode line 210*b* are different from each other. In this embodiment, the terminal 104*a*1 of the +polarity and the terminal 104*a*2 of the −polarity are located at different positions in the height direction. Therefore, the positive electrode line 210*a* and the negative electrode line 210*b* located at the positions described above are easily connectable with the corresponding terminals 104*a*1 and 104*b*1 by merely extending in a direction parallel to the light incident surface.

As shown in FIG. 3C, in this embodiment, the terminals 104*b*1 and 104*b*2 are not electrically connected with the device 101, and no electric current flows between the terminals 104*b*1 and 104*b*2. The state of connection between the device 101 and the four terminals 104*a*1, 104*a*2, 104*b*1 and 104*b*2 is not limited to such a state. For example, the device 101 may be connected with the terminals 104*a*1 and 104*b*2, and the terminal 104*a*1 may act as a terminal of the +polarity while the terminal 104*b*2 may act as a terminal of the −polarity.

<Method for Producing the Photoelectric Conversion Unit 1000>

Now, an example of method for producing the photoelectric conversion unit 1000 will be described.

First, the device 101 is located in a mold (not shown) used to form the package 102. The mold has a space defining an external shape of the package 102. A resin used to form the package 102 is injected into the mold. After the resin is cured, the photoelectric conversion unit 1000 is removed from the mold. In this state, the device 101 is accommodated in the package 102. The photoelectric conversion unit 1000 can be produced in this manner.

The method for producing the photoelectric conversion unit 1000 is not limited to the above-described example of method.

Embodiment 2

In embodiment 2 according to the present disclosure, a photoelectric conversion apparatus in which the package is separated (divided) into upper and lower parts will be described. In embodiment 1, the package 102 is integrally formed of an insulating material such as a resin or the like. In embodiment 2, a package 402 is separated into upper and lower parts during the production thereof.

Figure 4A:
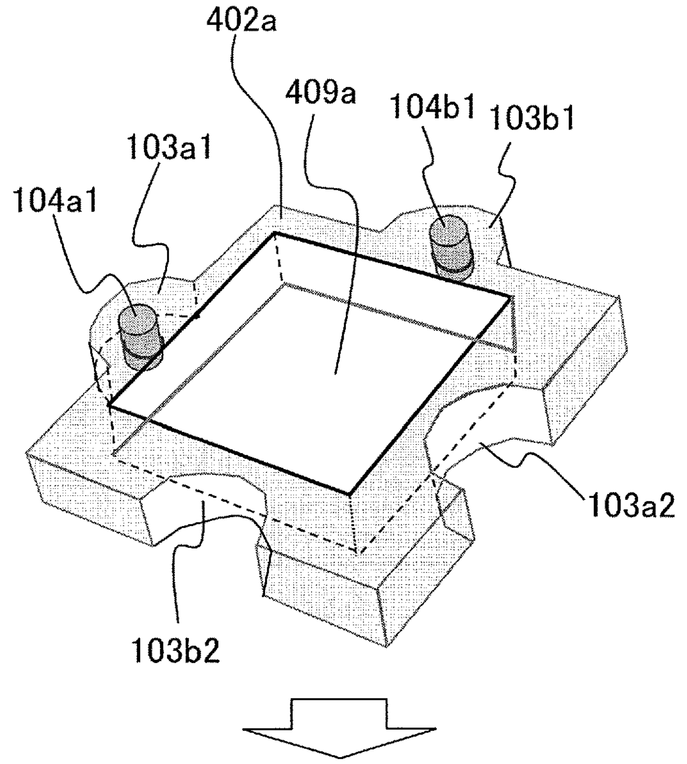
FIG. 4A is an isometric view showing an upper package.
Figure 4B:
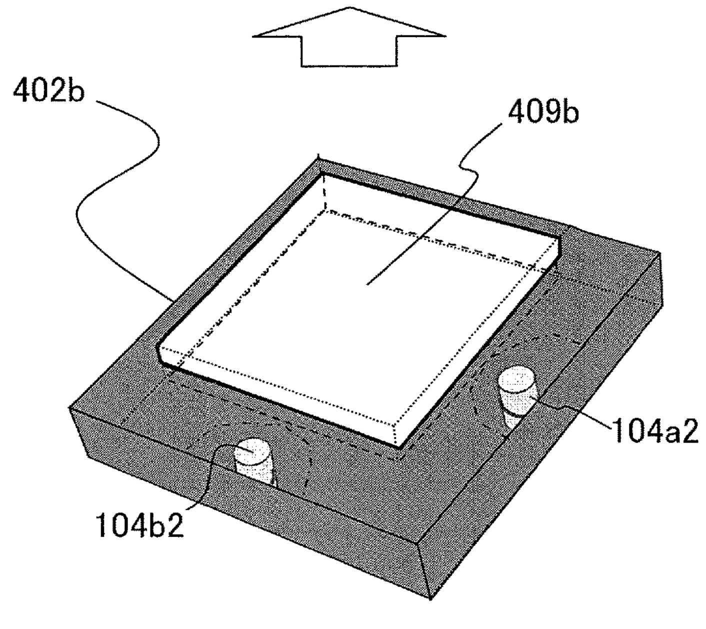
FIG. 4B is an isometric view showing a lower package.

FIG. 4A and FIG. 4B are respectively isometric views of an upper package (first divided package) 402*a* and a lower package (second divided package) 402*b*.

As shown in FIG. 4A, the upper package 402*a* includes an upper device accommodation portion 409*a*. The upper package 402*a* includes a first protrusion coupling portion 103*a*1, the first recessed coupling portion 103*a*2, the second protrusion coupling portion 103*b*1 and the second recessed coupling portion 103*b*2. By contrast, the lower package 402*b* does not include any coupling portion included in the upper package 402*a* and a flat side surface. The lower package 402*b* includes a recessed portion (device carrying portion) acting as a lower device accommodation portion 409*b*.

In this embodiment, a total depth of the upper device accommodation portion 409*a* and the lower device accommodation portion 409*b* is designed to be equal to the total thickness of the device 101 and the glass member 105. Because of this, the device 101 and the glass member 105, when being accommodated in the accommodation portions, are flush with an external surface of the package 102.

In the case where the device 101 is thinner than the upper package 402*a*, the lower device accommodation portion 409*b* does not need to be formed in the lower package 409*b*. In this case, a top surface of the lower package 402*b* may be flat, or may have a carrying table protruding into the upper device accommodation portion 409*a* to support the device 101.

Now, with reference to FIG. 5, a method for producing a photoelectric conversion unit 1000 in this embodiment will be described.

Figure 5A:
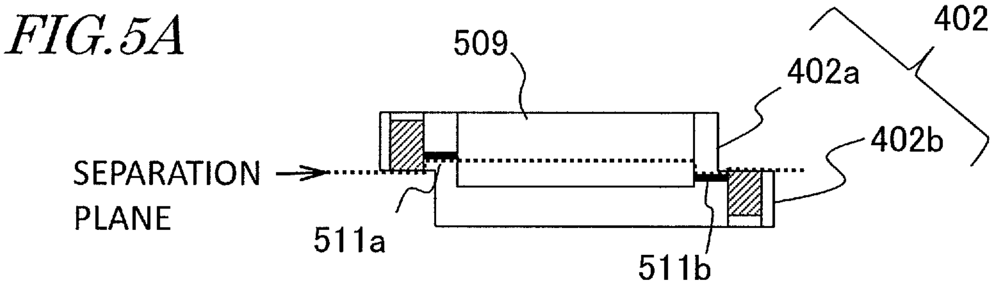
FIG. 5A, through FIG. 5D are cross-sectional views showing a production process of a photoelectric conversion apparatus using the upper and lower packages.

FIG. 5A is a cross-sectional view showing a state where the upper package 402*a* and the lower package 402*b* overlap each other. FIG. 5A shows a cross-section crossing the center of the terminal 104*a*1 and the center of the terminal 104*a*2 in FIG. 4. An opening of the upper package 402*a* (area enclosed by the dashed line in FIG. 5B) and a recessed space of the lower package 402*b* form a device accommodation portion 509. The opening of the upper package 402*a* and the recessed space of the lower package 402*b* are respectively the upper device accommodation portion 409*a* and the lower device accommodation portion 409*b* in FIG. 4.

The upper package 402*a* includes a package-side positive electrode line 511*a* formed therein. The line 511*a* overlaps the positive electrode line 210*a* of the device 101 to be electrically connected with the positive electrode terminal 104*a*1 in a final stage of production. Similarly, the lower package 402*b* includes a package-side negative electrode line 511*b* formed therein. The line 511*b* overlaps the negative electrode line 210*b* of the device 101 to be electrically connected with the negative electrode terminal 104*a*2 in the final stage of production.

Figure 5B:
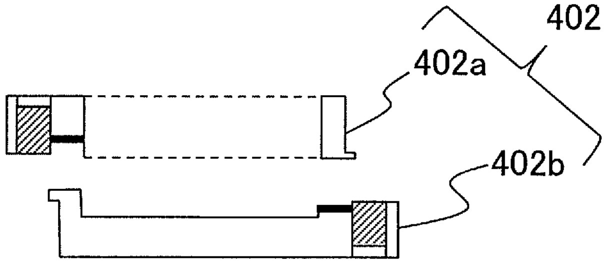

Next, as shown in FIG. 5B, the upper package 402*a* and the lower package 402*b* are separated from each other.

Figure 5C:
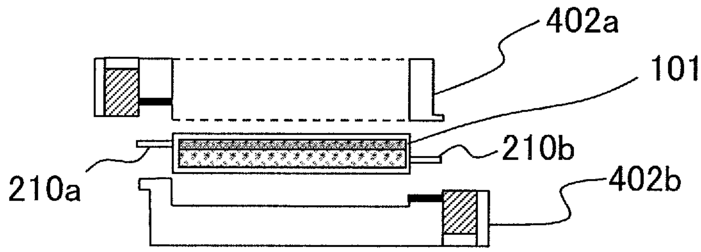

Then, as shown in FIG. 5C, the device 101 is located between the separated upper and lower packages 402*a* and 402*b*. The positive electrode line 210*a* and the negative electrode line 210*b* of the device 101, and the package-side positive electrode line 511*a* and the package-side negative electrode line 511*b*, are structured to realize the above-described electrical connection.

Figure 5D:
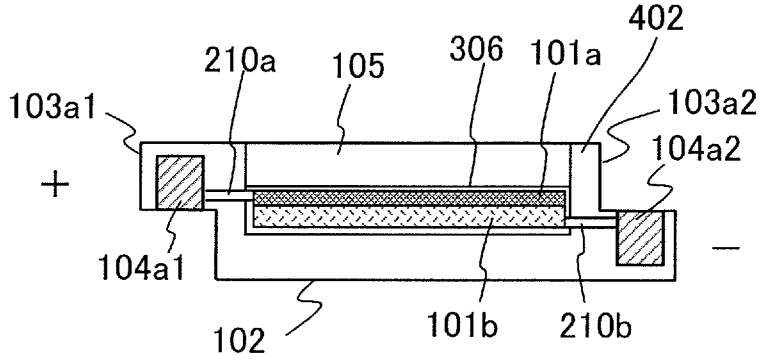

As shown in FIG. 5D, the upper package 402*a* and the lower package 402*b* are joined together to accommodate the device 101 in the package 402, and then the glass member 105 is attached to the opening of the upper package 402*a* so as to cover the device 101 accommodated in the package 402. In this manner, the photoelectric conversion unit 1000 can be produced.

Embodiment 3

In embodiment 2, the package is divided into upper and lower parts during the production. In this embodiment, the package is laterally separated in a horizontal direction.

Figure 6A:
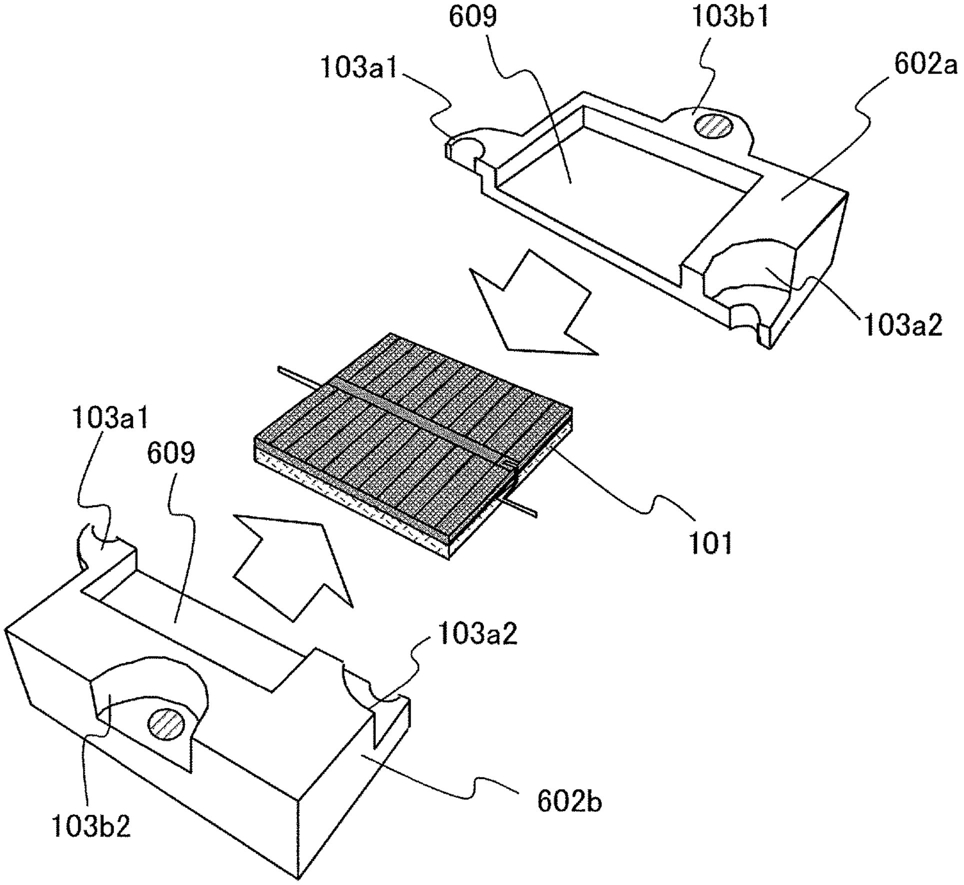
FIG. 6A is an isometric view showing a step of production of a photoelectric conversion unit using upper and lower divided packages.
Figure 6B:
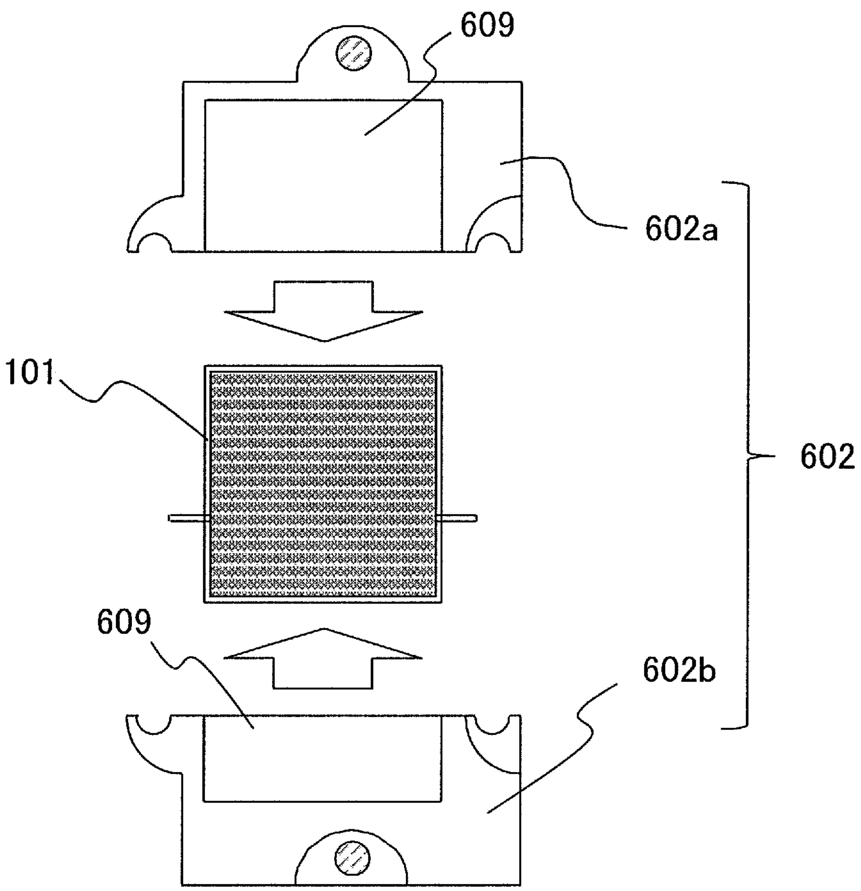
FIG. 6B is a plan view showing a step of production of the photoelectric conversion unit using the upper and lower divided packages.

FIG. 6A is an isometric view showing a step of production of a photoelectric conversion unit using left and right divided packages. FIG. 6B is a plan view showing a step of production of the photoelectric conversion unit using the left and right divided packages.

A first divided package 602*a* and a second divided package 602*b* form a package 602. The first divided package 602*a* includes a half of the first protruding coupling portion 103*a*1, the second protruding coupling portion 103*b*1 and a half of the first recessed coupling portion 103*a*2 formed therein. The second divided package 602*b* includes a half of the first protruding coupling portion 103*a*1, the second recessed coupling portion 103*b*2 and a half of the first recessed coupling portion 103*a*2 formed therein.

Figure 6C:
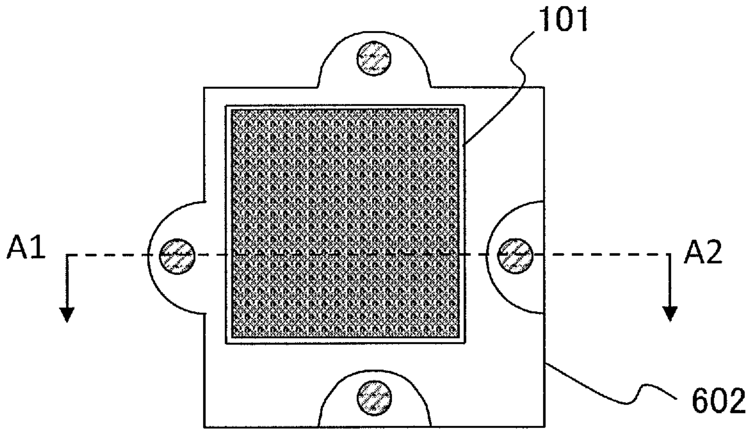
FIG. 6C is a plan view showing a step of production of a photoelectric conversion unit using left and right divided packages.
Figure 6D:
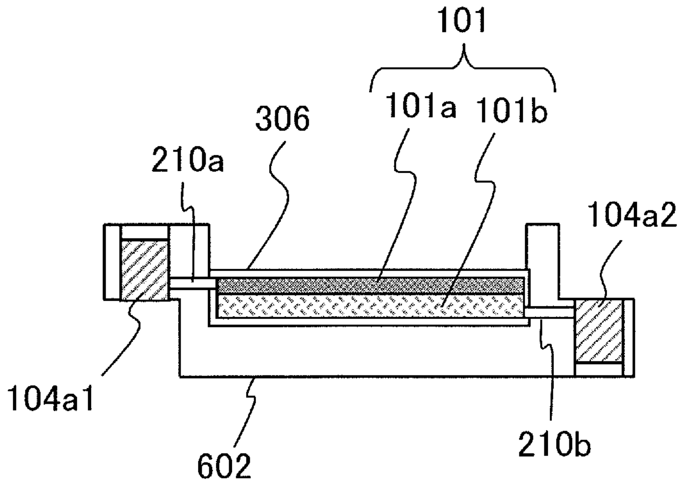
FIG. 6D is a cross-sectional view showing a step of production of the photoelectric conversion unit using the left and right divided packages.

After the device 101 is mounted on the device accommodation portion 609, the first divided package 602*a* and the second divided package 602*b* are joined together. In this manner, the package 602 is formed, and the photoelectric conversion unit 1000 is produced. FIG. 6C is a plan view of the photoelectric conversion unit 1000 produced in this manner, and FIG. 6D is a cross-sectional view thereof taken along line A1-A2.

Embodiment 4

Now, with reference to FIG. 7 and FIG. 8, embodiment 4 according to the present disclosure will be described.

In this embodiment, a photoelectric conversion device 701 has a structure different from that of the photoelectric conversion device in any of the above-described embodiments. This embodiment is the same as the above-described embodiments on the other points. Thus, only the structure of the photoelectric conversion device 701 will be described below.

Figure 7A:
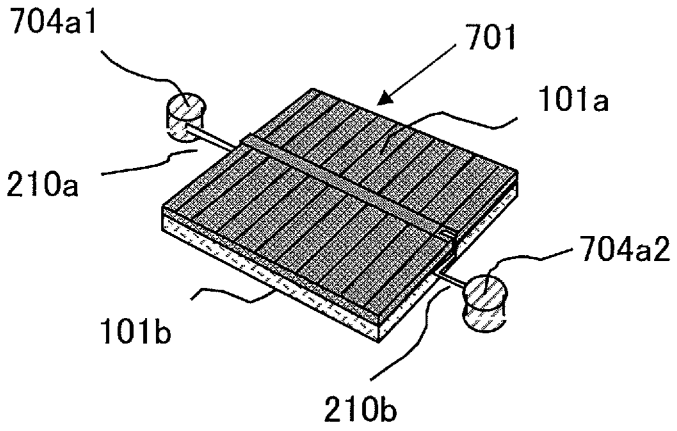
FIG. 7A through FIG. 7C show a structure of a photoelectric conversion device usable to produce a photoelectric conversion apparatus using upper and lower packages.
Figure 7B:
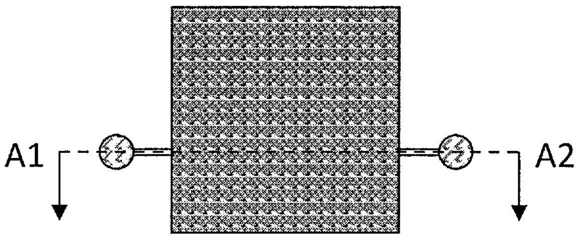
Figure 7C:
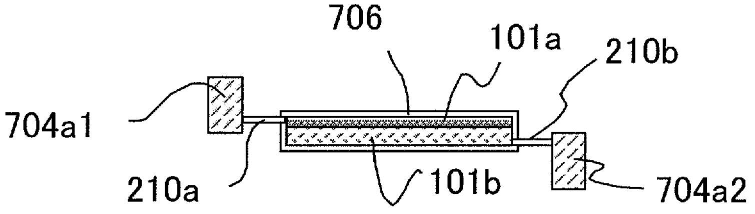

The photoelectric conversion device 701 in this embodiment shown in FIG. 7 basically has substantially the same structure as that of the photoelectric conversion device 101 shown in FIG. 2D and FIG. 2E, and includes a positive electrode terminal 704*a*1 connected with the positive electrode line 201*a* and a negative electrode terminal 704*a*2 connected with the negative electrode line 201*b*. A main body of the photoelectric conversion device 701 is covered with a light-transmissive and air-tight resin 706.

Now, with reference to FIG. 8, a method for producing a photoelectric conversion unit including the photoelectric conversion device 701 will be described. In this example, the divided packages described with reference to FIG. 6A and FIG. 6B are used.

Figure 8:
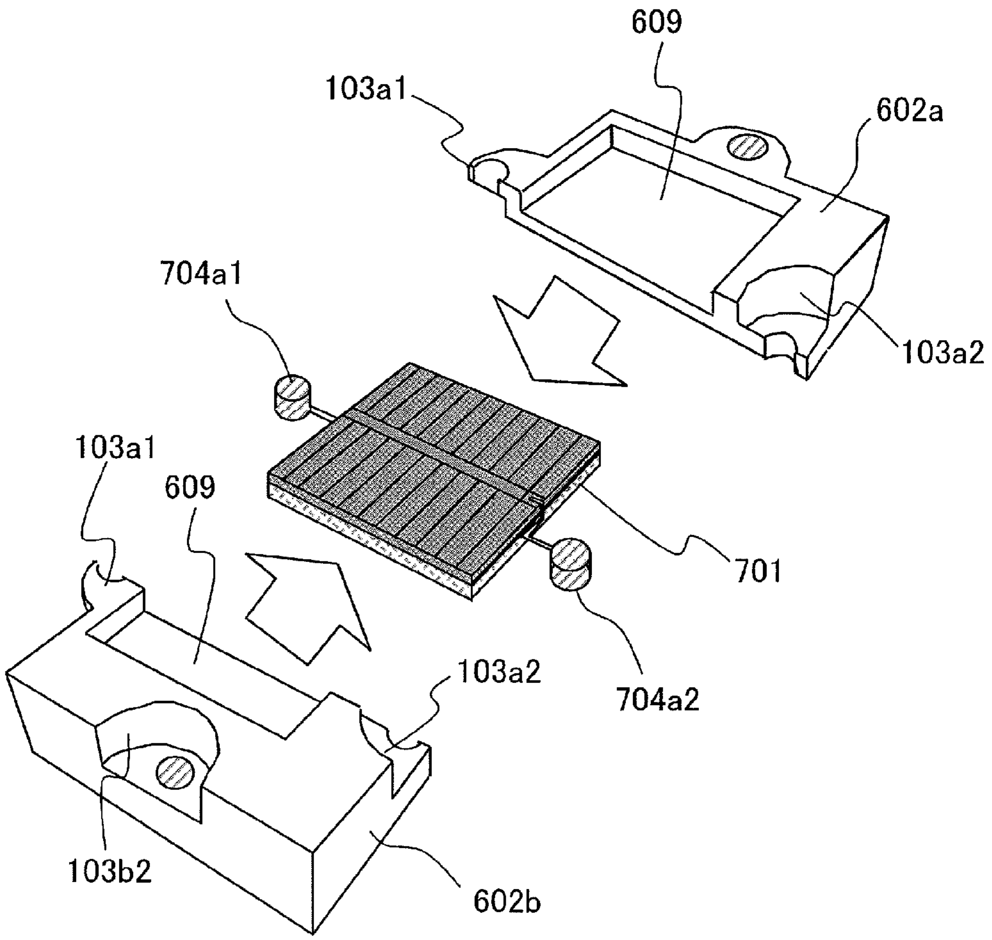
FIG. 8 is an isometric view showing a step of production of a photoelectric conversion apparatus using divided packages.

As shown in FIG. 8, the positive electrode terminal 704*a*1 is held by the half of the protruding coupling portion 103*a*1 of the first divided package and the half of the protruding coupling portion 103*a*1 of the second divided package. Similarly, the negative electrode terminal 704*a*2 is held by the half of the recessed coupling portion 103*a*2 of the first divided package and the half of the recessed coupling portion 103*a*2 of the second divided package. Thus, the photoelectric conversion unit 1000 is produced.

<Package Variation>

Figure 9A:
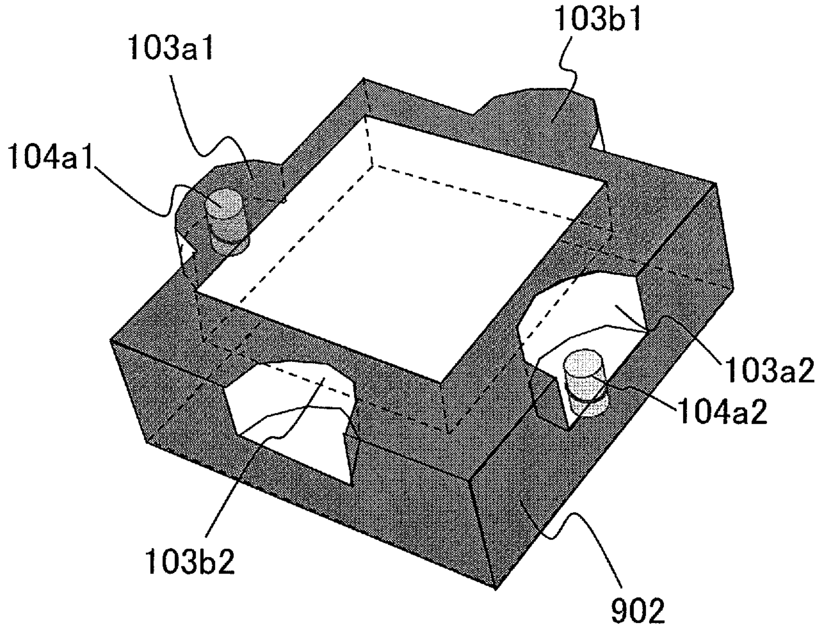
FIG. 9A and FIG. 9B are isometric views showing a variation of the package.
Figure 9B:
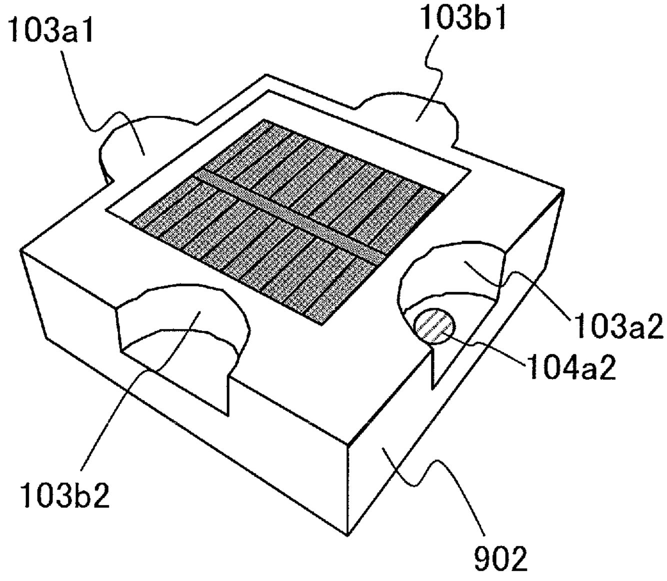

FIG. 9A and FIG. 9B are each an isometric view showing a variation of the package.

In a package 902 in this variation, neither the second protruding coupling portion 103*b*1 nor the second recessed coupling portion 103*b*2 includes a terminal. Only the coupling portions 103*a*1 and 103*a*2, which need to be electrically connected, each have a terminal. FIG. 9A shows the package 902 such that the inside thereof is seen, and thus shows the terminals 104*a*1 and 104*a*2 located inside the package 902. FIG. 9B shows an external appearance of the package 902. The front surface of the terminal 104*a*1 is covered with a resin and therefore is not seen at this angle. The front surface of the terminal 104*a*2 is exposed.

The first protruding coupling portion 103*a*1 and the first recessed coupling portion 103*a*1 are formed for mechanical and electrical connection. By contrast, the second protruding coupling portion 103*b*1 and the second recessed coupling portion 103*b*2 do not contribute to electrical connection, and are formed for mechanical connection.

<Structure in which Photoelectric Conversion Units Apparatuses are Connected with Each Other>

Figure 10:
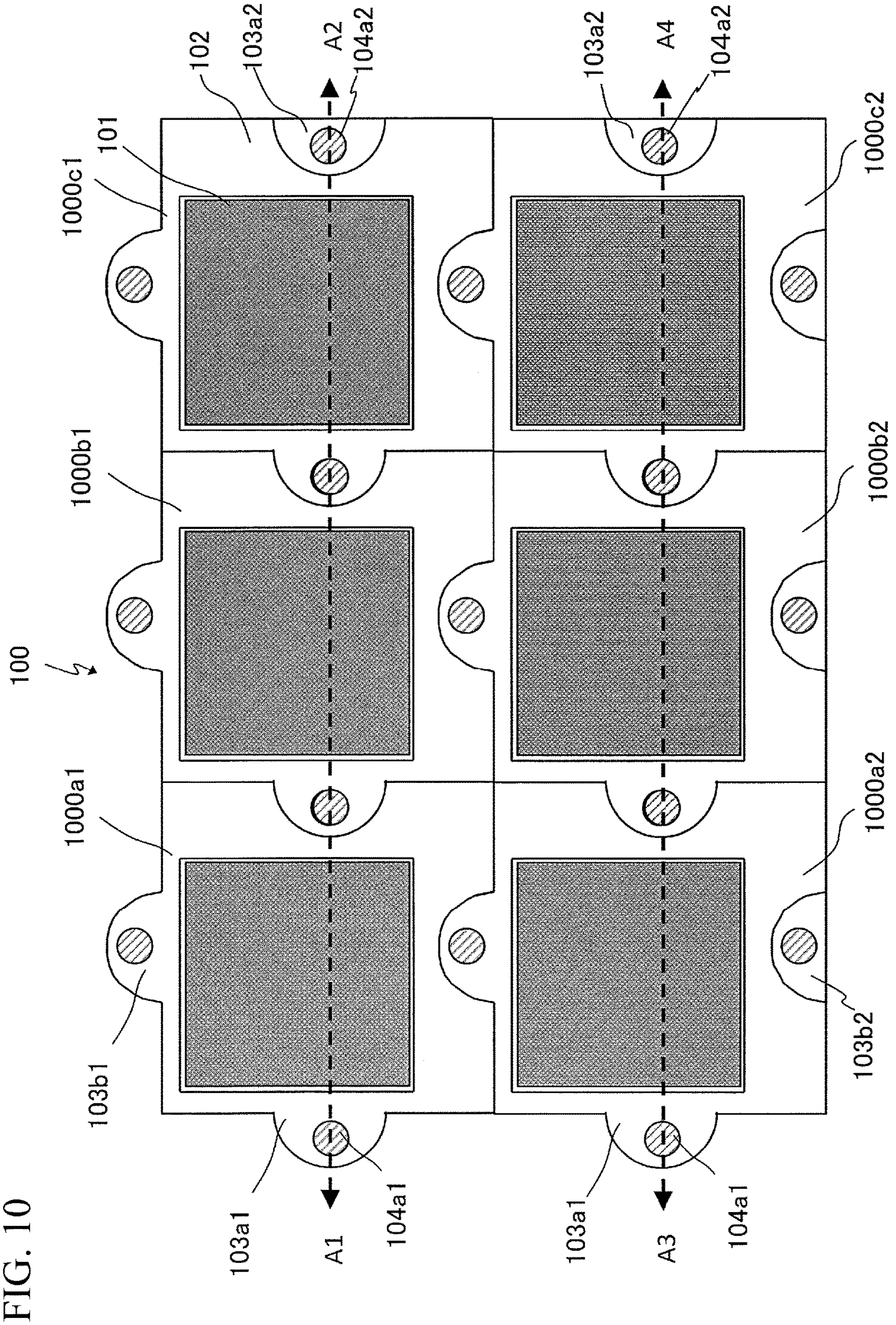
FIG. 10 is a plan view showing a photoelectric conversion apparatus in an embodiment according to the present disclosure.

FIG. 10 is a plan view of a photoelectric conversion apparatus in which six photoelectric conversion units are arrayed.

In this example, three photoelectric conversion units 1000*a*1, 1000*b*1 and 1000*c*1 are arrayed in a direction of line A1-A2, and are also electrically connected in series. Similarly, three photoelectric conversion units 1000*a*2, 1000*b*2 and 1000*c*2 are arrayed in a direction of line A3-A4, and are also electrically connected in series. The three photoelectric conversion units 1000*a*1, 1000*b*1 and 1000*c*1 arrayed in the direction of line A1-A2, and the three photoelectric conversion units 1000*a*2, 1000*b*2 and 1000*c*2 arrayed in the direction of line A3-A4, are not electrically connected with each other and merely connected mechanically. The photoelectric conversion units 1000*a*1, 1000*b*1, 1000*c*1, 1000*a*2, 1000*b*2 and 1000*c*2 in this embodiment each have the same structure as that of the photoelectric conversion unit 1000 in embodiment 1. These photoelectric conversion units may have the same structure as that of the photoelectric conversion unit 1000 in any other embodiment.

As can be seen from FIG. 10, the plurality of photoelectric conversion units 1000 are coupled like pieces of a jigsaw puzzle. The coupling portions 103*a*1 and 103*a*2 coupled with each other by fitting are not fixed by welding or an adhesive to be permanently coupled. Therefore, any photoelectric conversion unit is easily detachable.

In this embodiment, the photoelectric conversion units 1000 may be combined and arrayed at a high degree of freedom. In the example shown in FIG. 10, six photoelectric conversion units 1000 are arrayed in two rows by three columns (three units in the horizontal direction and two units in the vertical direction) in the figure. The photoelectric conversion units 1000 may be combined and arrayed in any manner.

In this embodiment, the structure of the photoelectric conversion apparatus 100 may be easily designed and constructed by a construction worker, or maintenance including replacement and repair of the photoelectric conversion units 1000 may be easily performed. A user may easily replace a photoelectric conversion unit 1000 fully charged in the photoelectric conversion apparatus 100 with an uncharged photoelectric conversion unit 1000.

<Structure of a Coupling Device (Connector)>

FIG. 11 shows a structure of a coupling device (connector) connecting the photoelectric conversion units 1000.

Figure 11A:
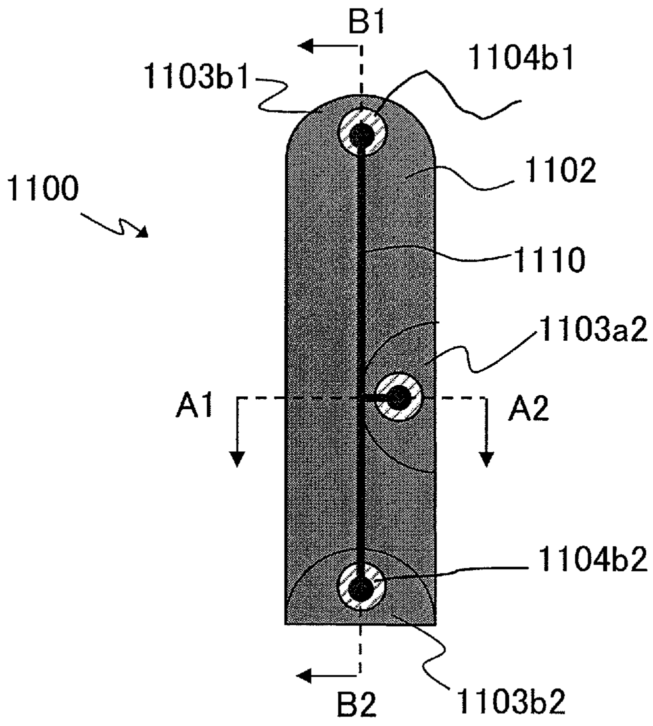
FIG. 11A is a plan view showing an example of structure of a coupling device for the photoelectric conversion unit.

FIG. 11A is a plan view of a connector 1100. The connector 1100 includes a protruding coupling portion **1103*b*1 formed at an end thereof. The coupling portion 1103*b*1 has a round, protruding shape. The coupling portion 1103*b*1 has a shape and a size that are the same as those of the protruding coupling portion of the photoelectric conversion unit. The protruding coupling portion 1103*b*1 includes a terminal 1104*b*1 formed therein. The terminal 1104*b*1 is connected with an internal line 1110**.

By contrast, the connector 1100 includes a recessed coupling portion **1103*b*2 formed at the other end thereof. The coupling portion 1103*b*2 has a round, recessed shape. The coupling portion 1103*b*1 has a shape and a size that are the same as those of the recessed coupling portion of the photoelectric conversion unit. The coupling portion 1103*b*2 includes a terminal 1104*b*2 formed therein. The terminal 1104*b*2 is connected with the internal line 1110**.

Figure 11B:
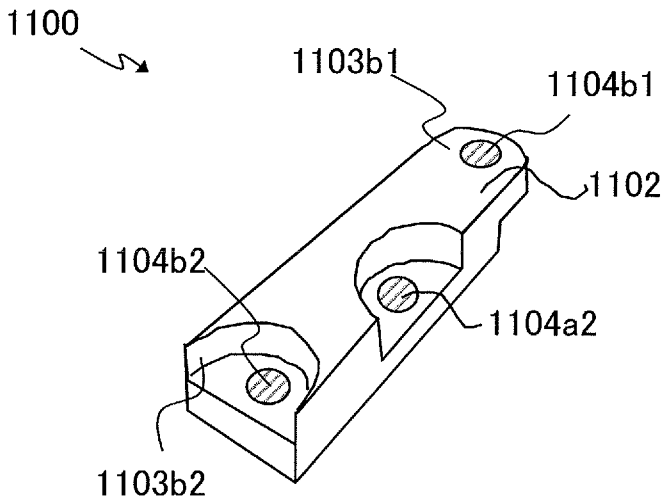
FIG. 11B is an isometric view thereof.

FIG. 11B is an isometric view showing a structure of the connector 1100. The protruding coupling portion **1103*b*1 is cut out in a bottom part thereof. In other words, the connector 1100 has a shape by which a top part protrudes at the one end thereof. By contrast, the recessed coupling portion 1103*b*2 is cut out in a top part thereof. The recessed coupling portion 1103*b*2 is recessed such that the protruding coupling portion 1103*b*1** closely fits thereto.

A recessed coupling portion **1103*a*2 is formed along a side between the one end and the other end of the connector 1100. The recessed coupling portion 1103*a*2 has the same shape as that of the recessed coupling portion 1103*b*2**.

Figure 12A:
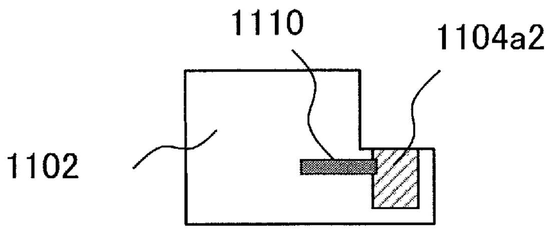
FIG. 12A is a cross-sectional view of the coupling device shown in FIG. 11A taken along line A1-A2.
Figure 12B:
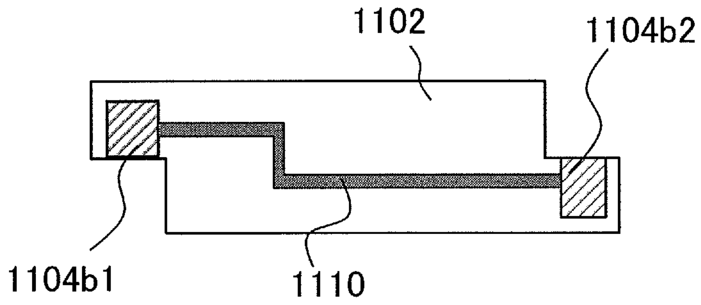
FIG. 12B is a cross-sectional view of the coupling device shown in FIG. 11A taken along line B1-B2.

FIG. 12A is a cross-sectional view of FIG. 11A taken along line A1-A2, and FIG. 12B is a cross-sectional view of FIG. 11A taken along line B1-B2. As shown in FIG. 12A and FIG. 12B, a connect electrode **1104*a*2 is formed along a side surface of a central part of the connector 1100. The connect electrode 1104*a*2 is connectable with the protruding coupling portion 103*a*1 of the photoelectric conversion unit 1000. In a main body 1102, the internal line 1110 is formed, and the line 1110 connects the connect electrode 1104*b*1 and the connect electrode 1104*b*2 with each other. Therefore, it is seen that the connect electrodes 1104*b*1, 1104*b*2 and 1104*a*2 are electrically connected with each other by the internal line 1110**.

As shown in FIG. 12, the connect electrode **1104*a*2 and the connect electrode 1104*b*2 have a top surface exposed for electrical connection, and has a bottom surface not exposed. By contrast, the connect electrode 1104*b*1** has a bottom surface exposed and has a top surface not exposed.

Figure 13:
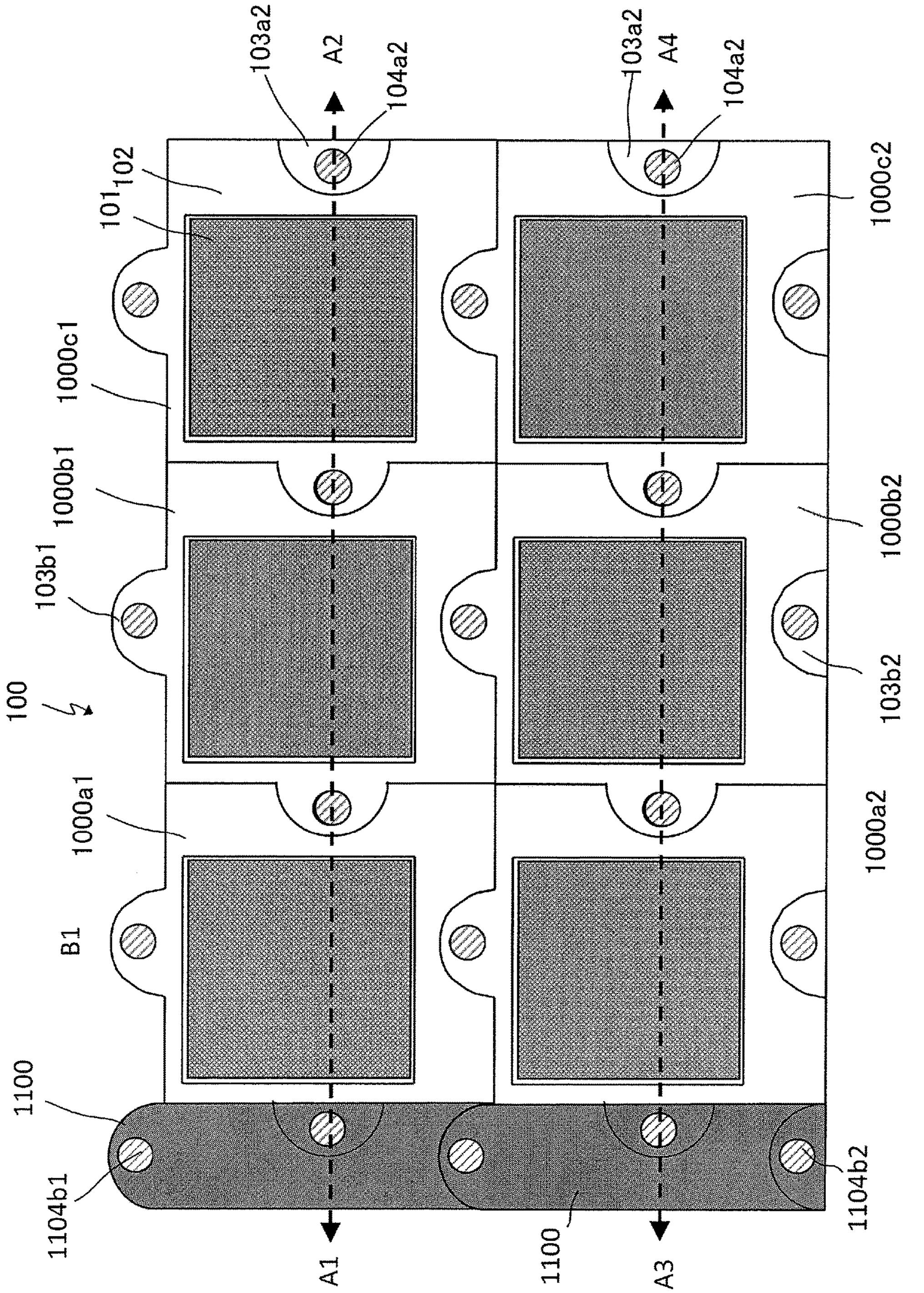
FIG. 13 is a plan view of a photoelectric conversion apparatus in another embodiment according to the present disclosure.

With reference to FIG. 13, an embodiment in which groups each including three photoelectric conversion units connected in series are connected with each other in parallel by the connectors 1100. The photoelectric conversion apparatus 100 shown in FIG. 13 has the same general structure as that of the photoelectric conversion apparatus 100 shown in FIG. 10, except that the photoelectric conversion apparatus shown in FIG. 13 includes two connectors 1100. The two connectors 1100 coupled with each other connect the "three photoelectric conversion units coupled in the direction of line A1-A2" and the "three photoelectric conversion units coupled in the direction of line A3-A4" with each other in parallel. Because of this structure, the connectors 1100 may act as a line, and also a potential of the two groups of photoelectric conversion units connected in parallel, each group including three photoelectric conversion units connected in series, may be taken out from the terminal **1104*b*1 and the terminal 1104*b*2**.

The connector coupling the photoelectric conversion units 1000 is not limited to having the structure shown in FIG. 11. The connector may have any overall shape or size as long as including a coupling portion mechanically connectable by fitting or the like with the recessed or protruding coupling portion of the photoelectric conversion unit and also including a terminal and a line that realize electrical connection at the coupling portion. The connector may having, for example, a shape of a "frame" enclosing the coupled photoelectric conversion units, or may be striped-shaped or lattice-shaped so as to be directly coupled with each photoelectric conversion unit.

<Form of Use of the Photoelectric Conversion Unit>

Figure 14:
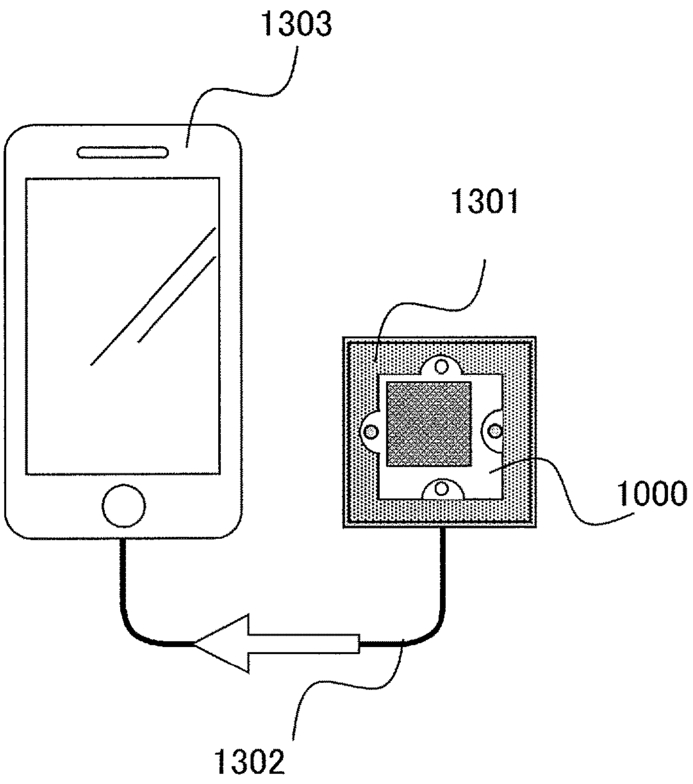
FIG. 14 shows a form of use of a photoelectric conversion unit.

FIG. 14 shows how an electronic device is charged by use of the photoelectric conversion unit 1000. The photoelectric conversion unit 1000 is, for example, the photoelectric conversion unit 1000 shown in FIG. 2A, and the device 101 accommodated in the package thereof includes the electric power storage portion **101*b***.

As shown in FIG. 14, a smartphone 1303 is charged by the electric power storage portion **101*b*. The photoelectric conversion unit 1000 may be treated as one piece of a jigsaw puzzle, and therefore the photoelectric conversion unit 1000 charged by the electric power storage portion 101*b*** is independently usable to charge an electronic device.

In the example shown in FIG. 14, the smartphone 1303 is connected with an adaptor 1301 via a connection cable 1302. The cable 1302 connected with the adaptor 1301 is connected with a USB (Universal Serial Bus) terminal of the smartphone 1303. The adaptor 1301 has the photoelectric conversion unit 1000 mounted thereon, and supplies power accumulated in the electric power storage portion **101*b* of the photoelectric conversion unit 1000 to the smartphone 1303 and thus charges the smartphone 1303. In the example shown in FIG. 14, the photoelectric conversion portion of the photoelectric conversion unit 1000** may generate power by light irradiation even during charging.

The photoelectric conversion unit 1000 in this example has, for example, a length of about 20 mm, a width of about 20 mm and a thickness of about 3 mm, and thus is compact and convenient to carry around. The mechanical and electrical connection between the adaptor 1301 and the photoelectric conversion unit 1000 may be realized, for example, like the connection between the coupling portion and the connect electrode included in the connector 1100.

The photoelectric conversion unit 1000 does not need to have a size suitable to carry around. For example, the photoelectric conversion unit 1000 may have a length exceeding 100 mm, a width exceeding 150 mm and a thickness exceeding 10 mm. One adaptor 1301 may have a structure allowing a plurality of photoelectric conversion units 1000 to be attached thereto. In one adaptor 1301, such a plurality of photoelectric conversion units 1000 may be stacked or arrayed side by side.

The electronic device may include a mechanism by which the electronic device directly accommodates, and thus is electrically connected with, the photoelectric conversion unit 1000 without using the adaptor.

<Other Examples of Shape of the Photoelectric Conversion Unit>

The photoelectric conversion unit in each of the above-described embodiments is generally square as seen from the front surface side. The shape of the photoelectric conversion unit according to the present disclosure as seen from the front surface side is not limited to square. For example, the photoelectric conversion unit may be rectangular as shown in FIG. 15, triangular as shown in FIG. 16, or of any other shape (polygonal, for example, hexagonal) shown in the figures. The photoelectric conversion units arrayed in one photoelectric conversion apparatus do not need to have a common shape or size, and photoelectric conversion units of various shapes and sizes may be coupled with each other.

Figure 15A:
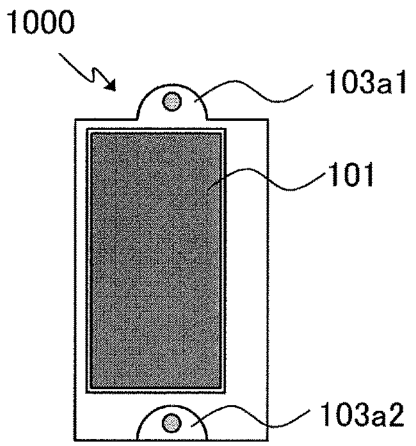
FIG. 15A is a plan view showing another example of photoelectric conversion unit.
Figure 15B:
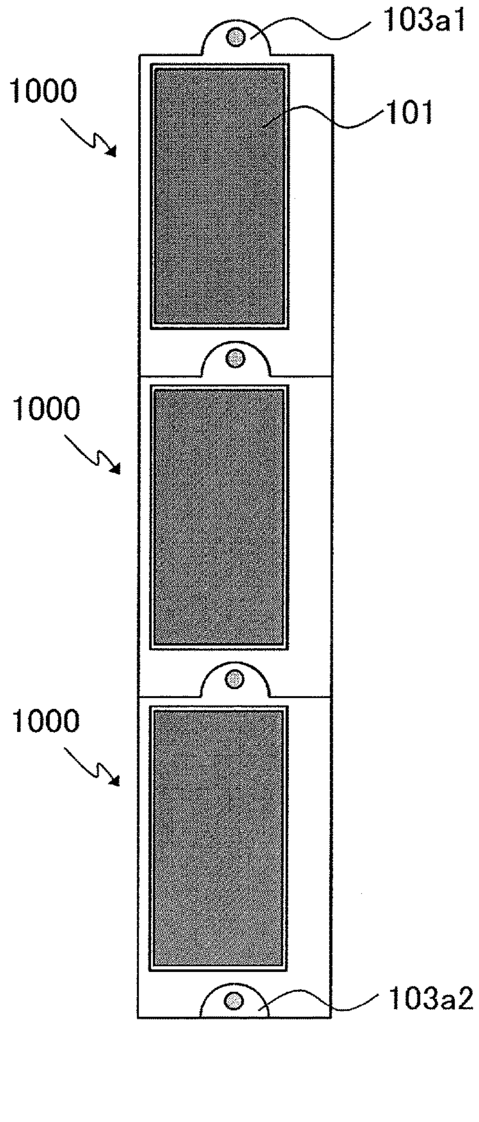
FIG. 15B is a plan view showing an example of photoelectric conversion apparatus including the photoelectric conversion units shown in FIG. 15A coupled with each other.

FIG. 15A is a plan view of a photoelectric conversion unit, and FIG. 15B shows a photoelectric conversion apparatus including three photoelectric conversion units 1000 shown in FIG. 15A coupled in series.

Figure 16A:
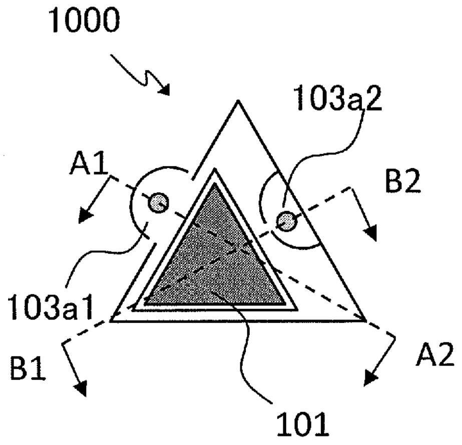
FIG. 16A is a plan view showing still another example of photoelectric conversion unit.
Figure 17A:
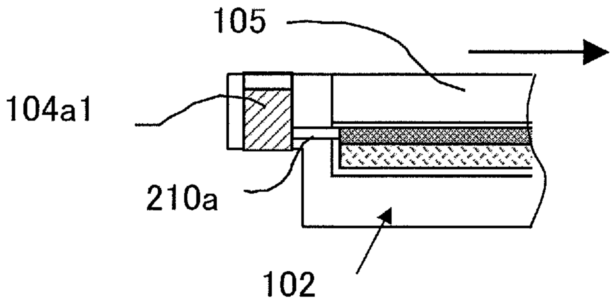
FIG. 17A is a cross-sectional view of the photoelectric conversion unit shown in FIG. 16A taken along line A1-A2.
Figure 17B:
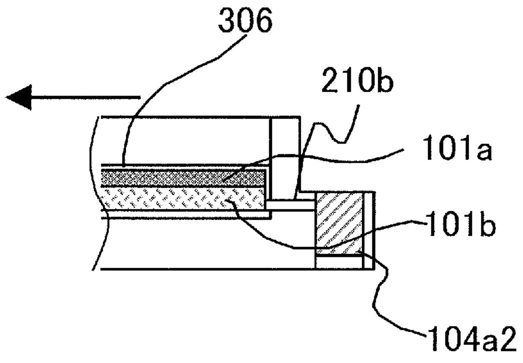
FIG. 17B is a cross-sectional view thereof taken along line B1-B2.

The photoelectric conversion unit 1000 shown in FIG. 16A is equilateral triangular as seen from the front surface side. FIG. 17A is a cross-sectional view of FIG. 16A taken along line A1-A2, and FIG. 17B is a cross-sectional view of FIG. 16A taken along line B1-B2.

Figure 16B:
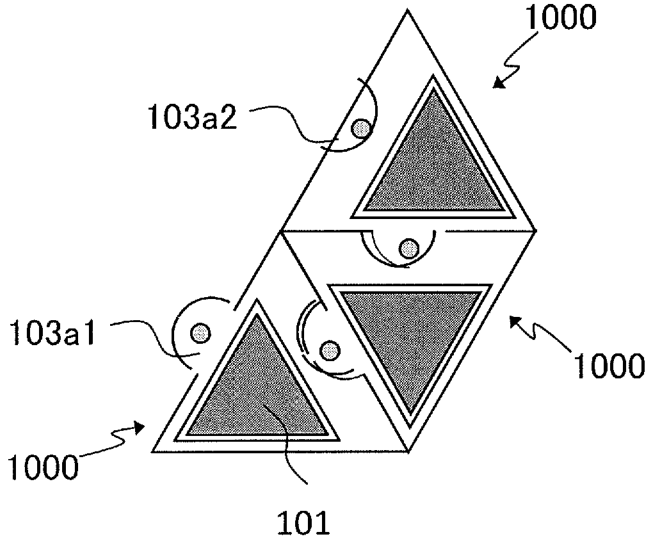
FIG. 16B is a plan view showing an example of photoelectric conversion apparatus including the photoelectric conversion units shown in FIG. 16A coupled with each other.

As can be seen from FIG. 16 and FIG. 17, one protruding coupling portion 103*a*1 is provided at one side of the equilateral triangle, and a recessed coupling portion 103*a*2 is provided at one of the other sides. As shown in FIG. 16B, the protruding coupling portion 103*a*1 and the recessed coupling portion 103*a*2 are coupled, and are thus electrically connected, with each other. In this example, the light incident surface of each photoelectric conversion device 101 is triangular, but the general shape of the front surface of the package and the general shape of the photoelectric conversion device do not need to match each other.

<Internal Circuit of the Photoelectric Conversion Device>

Figure 18:
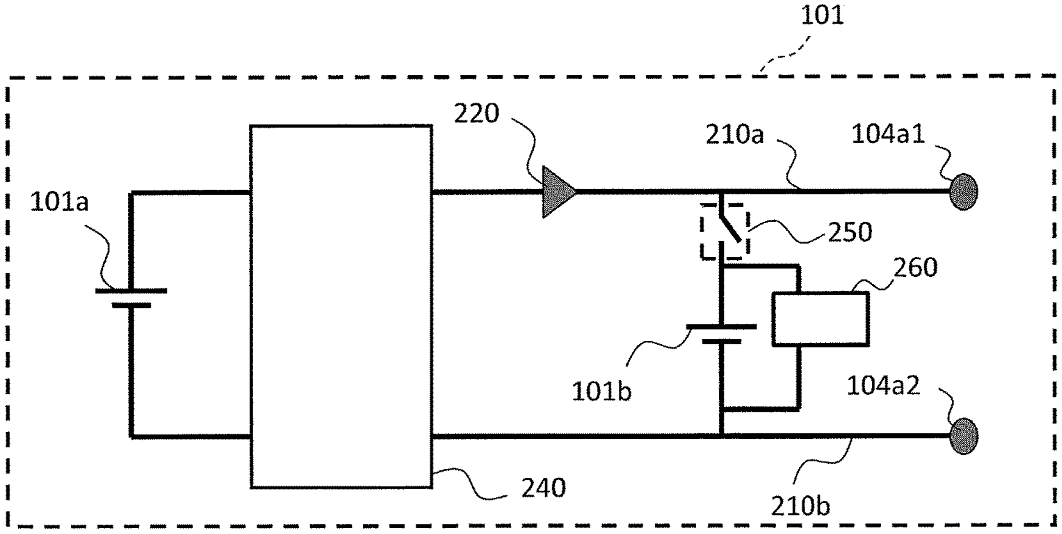
FIG. 18 is another equivalent circuit diagram of a photoelectric conversion device in an embodiment according to the present disclosure.

FIG. 18 is an equivalent circuit diagram of another example of the photoelectric conversion device 101 in an embodiment according to the present disclosure. The equivalent circuit shown in FIG. 18 is different from the equivalent circuit shown in FIG. 2E on the following points. A circuit shown in FIG. 19 (internal circuit) includes a voltage boost 240, a switch circuit 250, and a voltage monitor 260, and controls charging. The switch circuit 250 may be, for example, a MOS-type transistor or a bipolar transistor.

In the photoelectric conversion device 101 having the circuit configuration shown in FIG. 18, the photoelectric conversion portion 101*a* is connected with the voltage boost circuit 240. The voltage boost circuit 240 boosts the voltage generated in the photoelectric conversion portion 101*a* to, for example, about 5 volts. The voltage monitor circuit 260 is connected with a positive electrode and a negative electrode of the electric power storage portion 101*b*. The voltage monitor circuit 260 measures the voltage of the electric power storage portion 101*b*. Based on the voltage of the electric power storage portion 101*b*, the electric power storage state of the electric power storage portion 101*b* (whether the electric power storage portion 101*b* is fully charged or uncharged) may be determined.

The switch circuit 250 is connected with the electric power storage portion 101*b* in series between the positive electrode line 210*a* and the negative electrode line 201*b*. The switch circuit 250 controls the electric current flowing in the electric power storage portion 101*b* in accordance with the voltage of the electric power storage portion 101*b*. For example, when the electric power storage portion 101*b* is monitored by the voltage monitor circuit 260 to be fully charged, the switch circuit 250 may be turned off to block the flow of the electric current. When the switch circuit 250 is turned off, the voltage (current) generated in the photoelectric conversion portion 101*a* may be supplied between the positive electrode terminal 104*a*1 and the negative electrode terminal 104*a*2. As described later, this voltage (current) may be used to charge the electric power storage portion 101*b* of another photoelectric conversion device not shown in FIG. 18.

The voltage monitor circuit 260 and the switch circuit 250 may be electrically connected each other without using any special control circuit. The voltage monitor circuit 260 and the switch circuit 250 may be structured such that an ON/OFF operation of the switch circuit 250 is controlled in accordance with the voltage of the electric power storage portion 101*b*. In the case where, for example, the switch circuit 250 is a MOS-type transistor, a circuit configuration that applies a potential in accordance with the voltage of the electric power storage portion 101*b* to a gate electrode of the MOS-type transistor may be used, so that each of the photoelectric conversion devices has a necessary function.

When the electric power storage portion 101*b* is not fully charged, the switch circuit 250 is turned on depending on the detection results provided by the voltage monitor circuit 260. The voltage generated by the photoelectric conversion portion 101*a* as a result thereof is applied to the photoelectric conversion portion 101*a* via the voltage boost circuit 240. Thus, the current flows to the electric power storage portion 101*b* to charge the electric power storage portion 101*b*.

Figure 19:
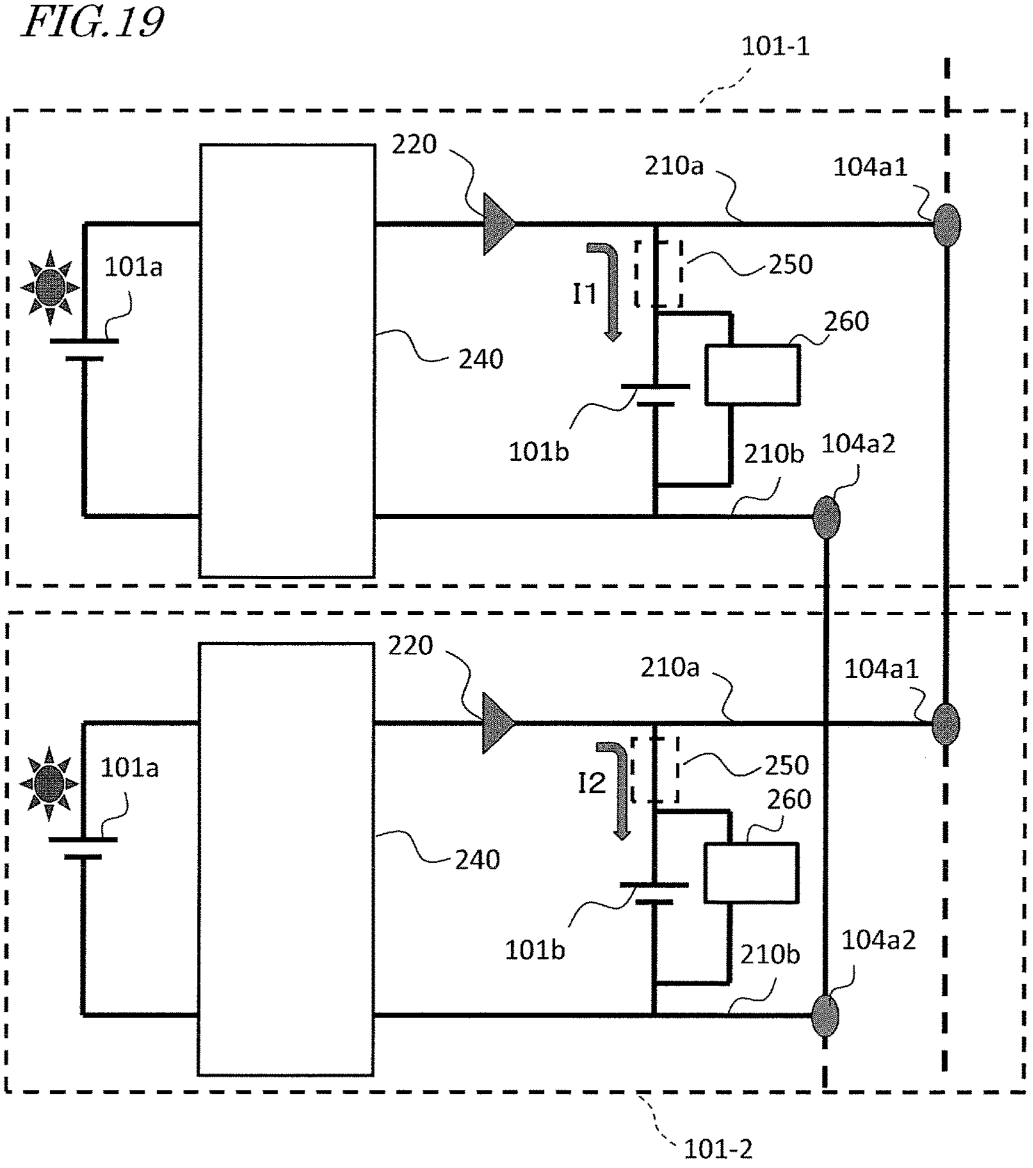
FIG. 19 is an equivalent circuit diagram of a main part of a photoelectric conversion apparatus in an embodiment according to the present disclosure.

FIG. 19 shows a part of an equivalent circuit diagram of a photoelectric conversion apparatus including a plurality of photoelectric conversion devices connected with each other. This connection may be realized by combining and arraying a plurality of photoelectric conversion units 1000 two dimensionally as shown in, for example, FIG. 13. FIG. 19 shows a structure in which basic circuits (internal circuits) shown in FIG. 18 are connected in parallel.

Hereinafter, a photoelectric conversion device 101-1 in the figure will be referred as "cell 1", and a photoelectric conversion device 101-2 in the figure will be referred as "cell 2". The corresponding positive electrode terminals 104*a*1 of cell 1 and cell 2 are connected with each other, and the corresponding negative electrode terminals 104*a*2 of cell 1 and cell 2 are connected with each other. The circuit of each of cell 1 and cell 2 has substantially the same configuration as that of the circuit shown in FIG. 18, and thus the circuit configuration of cells 1 and 2 will not be described in repetition here.

In the example shown in FIG. 19, neither the electric power storage portion 101*b* of cell 1 nor the electric power storage portion 101*b* of cell 2 is fully charged. The photoelectric conversion portion 101*a* of cell 1 and the photoelectric conversion portion 101*a* of cell 2 both receive light to generate a voltage. In this case, the electric power storage portions 101*b* have a low voltage, and therefore, the switch circuits 250 of cell 1 and cell 2 are both turned on to charge the electric power storage portions 101*b* of the respective cells.

In this embodiment, the electric power storage portion 101*b* of each of the photoelectric conversion devices 100 can be charged while the plurality of photoelectric conversion units 1000 are mutually connected. Namely, necessary charge can be performed without detaching, one by one, the plurality of photoelectric conversion units 1000 connected with each other electrically/mechanically, namely, while the plurality of photoelectric conversion units 1000 are in the state shown in, for example, FIG. 13. As can be seen from this, in the photoelectric conversion apparatus in this embodiment, the plurality of photoelectric conversion units (photoelectric conversion devices 100) can be operated while being connected with each other for accumulating power in the photoelectric conversion devices 100 as well as for taking out power outside from the photoelectric conversion devices 100. This provides advantages described later.

In an embodiment according to the present disclosure, the number of the cells (photoelectric conversion devices) mutually connected is not limited to two, and may be three or more.

Figure 20:
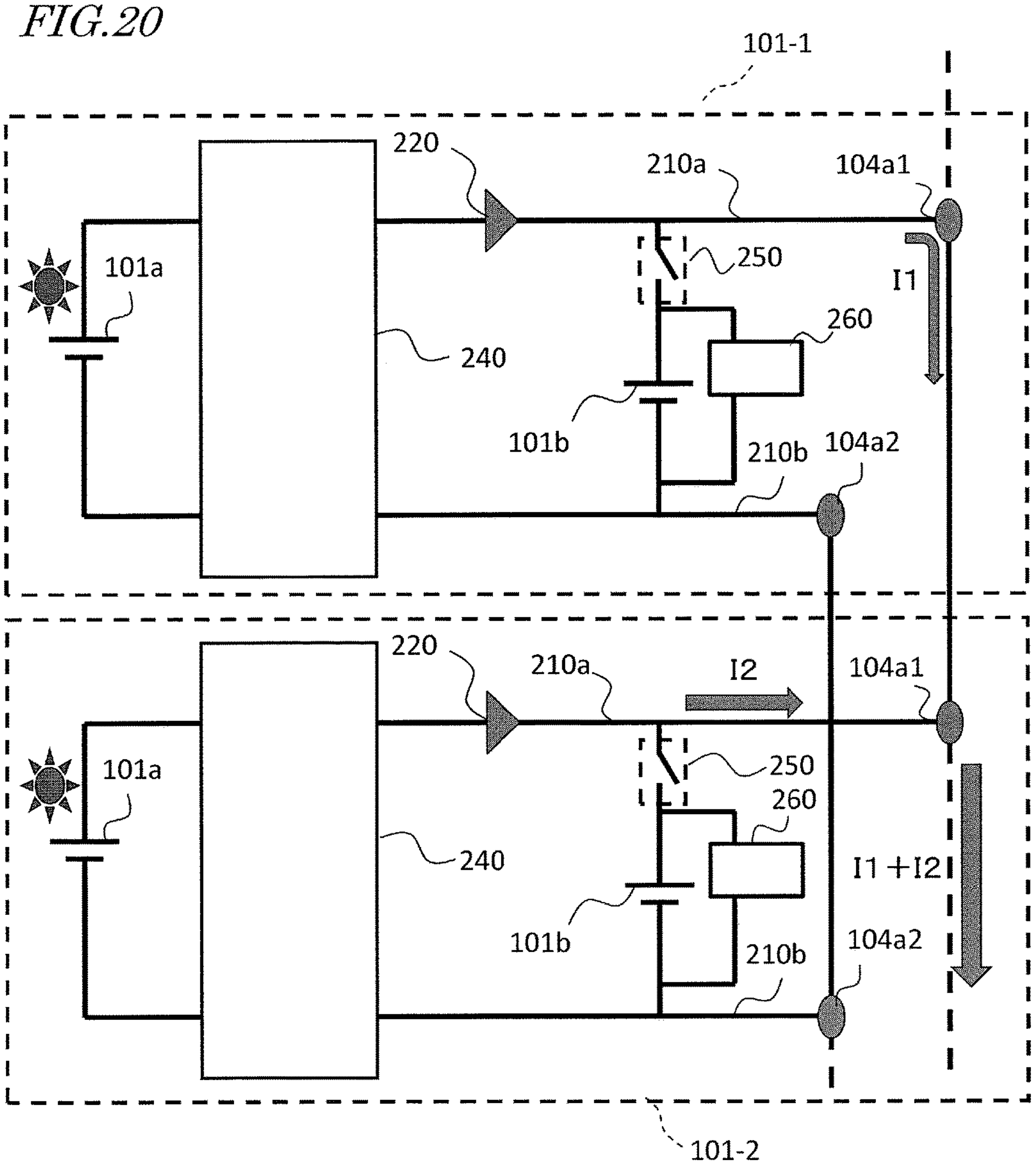
FIG. 20 is an equivalent circuit diagram of a main part of a photoelectric conversion apparatus in an embodiment according to the present disclosure.

FIG. 20 shows an example in which the electric power storage portion 101*b* of cell 1 and the electric power storage portion 101*b* of cell 2 are both fully charged. In this example, light is incident on both of the photoelectric conversion portion 101*a* of cell 1 and the photoelectric conversion portion 101*a* of cell 2 to generate a voltage in both of cells 1 and 2. In this case, the switch circuits 250 of cell 1 and cell 2 are both turned off. As a result, the electric power storage portions 101*b* of cells 1 and 2 are not charged. The current is used to charge a cell (not shown) other than cells 1 and 2. This will be described in more detail. Current I1 flows from cell 1, and current I2 flows from cell 2. Current I1+I2 flows from cells 1 and 2 to an external cell and is used to charge an electric power storage portion that is not fully charged. In this embodiment, in the case where the electric power storage portion 101*b* of any one of the plurality of photoelectric conversion devices mutually connected is fully charged, the power generated in the one photoelectric conversion device may be used to charge the electric power storage portion 101*b* of any of the other photoelectric conversion devices connected thereto without being wasted.

Figure 21:
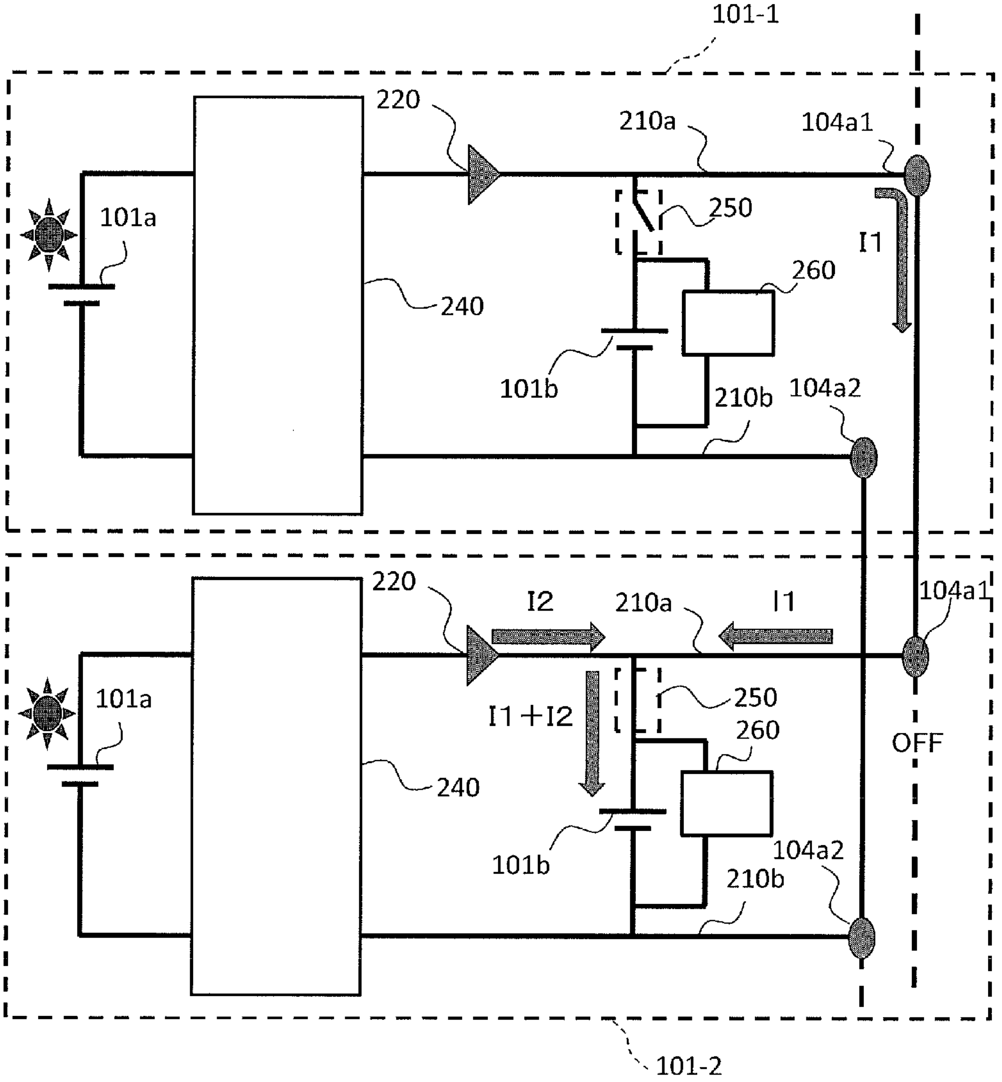
FIG. 21 is an equivalent circuit diagram of a main part of a photoelectric conversion apparatus in an embodiment according to the present disclosure.

FIG. 21 shows an example in which the electric power storage portion 101*b* of cell 1 is fully charged whereas the electric power storage portion 101*b* of cell 2 is uncharged. In this example, the photoelectric conversion portion 101*a* of cell 1 and the photoelectric conversion portion 101*a* of cell 2 both receive light to generate a voltage. In this case, the switch circuit 250 of cell 1 is turned off whereas the switch circuit 250 of cell 2 is turned on. As a result, the electric power storage portion 101*b* of cell 1 is not charged, and current I1 generated in cell 1 flows to cell 2 to be used to charge the electric power storage portion 101*b* of cell 2. Thus, current I1+I2 is used to charge the electric power storage portion 101*b* of cell 2 in addition to current I2 generated in cell 2. Therefore, the charge time is shorter than in the case where the electric power storage portion 101*b* of cell 2 is charged only with the current generated in cell 2. As can be seen from this, in this embodiment, in the case where the electric power storage portion 101*b* of one cell is fully charged, the power generated in the one cell may be used to charge the electric power storage portion 101*b* of any other cell without being wasted.

Figure 22:
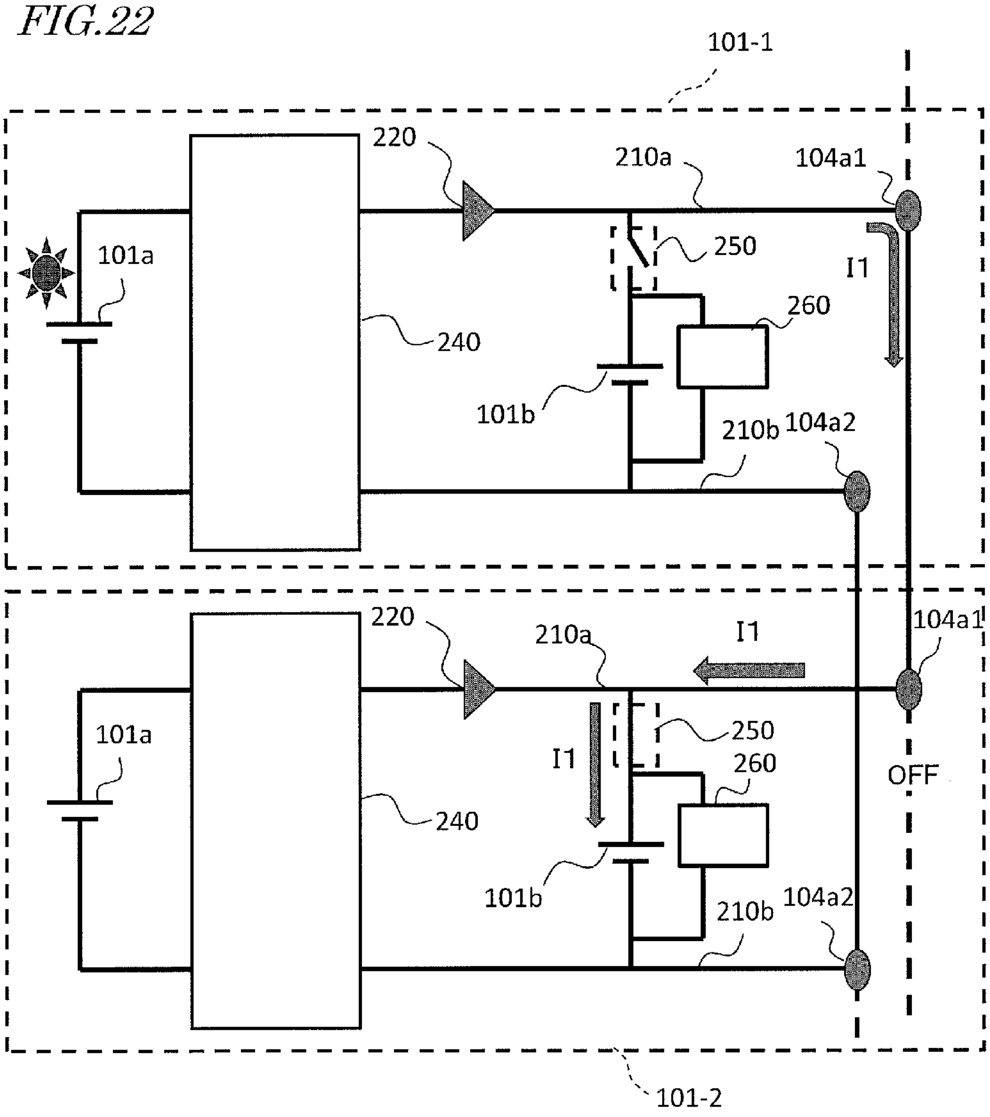
FIG. 22 is an equivalent circuit diagram of a main part of a photoelectric conversion apparatus in an embodiment according to the present disclosure.

FIG. 22 shows an example in which the electric power storage portion 101*b* of cell 1 is fully charged whereas the electric power storage portion 101*b* of cell 2 is uncharged. In this example, light is incident on the photoelectric conversion portion 101*a* of cell 1 whereas no light is incident on the photoelectric conversion portion 101*a* of cell 2. Therefore, a voltage is generated in the photoelectric conversion portion 101*a* of cell 1, whereas no voltage is generated in the photoelectric conversion portion 101*a* of cell 2. In such a case, the switch circuit 250 of cell 1 is turned off whereas the switch circuit 250 of cell 2 is turned on. As a result, the electric power storage portion 101*b* of cell 1 is not charged, and the current flows from cell 1 to cell 2 to be used to charge the electric power storage portion 101*b* of cell 2. Current I1 generated in cell 1 flows to cell 2 (current: I1) to be used to charge the electric power storage portion 101*b* of cell 2. This allows the electric power storage portion 101*b* of cell 2 to be charged even though no voltage is generated in the photoelectric conversion portion 101*a* of cell 2. As can be seen from this, in this embodiment, when the electric power storage portion 101*b* of one cell is fully charged, the voltage/current generated in the one cell may be used to charge the electric power storage portion 101*b* of an adjacent cell without being wasted.

In the above-described embodiments, each of the plurality of photoelectric conversion devices mutually connected electrically includes a photoelectric conversion portion, an electric power storage portion electrically connected with the photoelectric conversion portion, and a charge control circuit (switch circuit and voltage monitor circuit). Therefore, charge with reduced waste can be performed in accordance with the charged state and the state of light incidence of the plurality of electric power storage portions included in one photoelectric conversion apparatus. Namely, necessary charge can be performed without detaching, one by one, the plurality of photoelectric conversion units 1000 connected with each other electrically/mechanically. As can be seen from this, in the photoelectric conversion apparatus in this embodiment, the plurality of photoelectric conversion units (photoelectric conversion devices 100) can be operated while being connected with each other for accumulating power in the photoelectric conversion devices 100 as well as for taking out power outside from the photoelectric conversion devices 100.

A control circuit that controls the switch circuit 250 to be on or off based on the output of the voltage monitor circuit 260 may be located outside each photoelectric conversion device. For example, such a charge control circuit may be entirely or partially provided in the connector 1110 (coupling device) shown in FIG. 13.

In the case of including a photoelectric conversion portion, an electric power storage portion and a charge control circuit, each photoelectric conversion unit 1000 may generate power, and may be charged, independently even if not being connected with any other photoelectric conversion unit.

In each of the above-described embodiments, the photoelectric conversion units may be "coupled or detached" easily like pieces of a "jigsaw puzzle". Therefore, the photoelectric conversion units may be combined at a higher level of freedom. Therefore, the number and the connection form of the photoelectric conversion units included in a photoelectric conversion apparatus may be freely set or changed in accordance with the voltage required to be output by the photoelectric conversion apparatus.

In the embodiment in which the coupling portions are coupled with each other by "fitting", the coupling portions are not easily decoupled at the time of general handling or by impact in use, and the user or the construction worker may easily perform attachment or detachment. Therefore, the maintenance is easy, and any photoelectric conversion unit(s) may be detached from the plurality of photoelectric conversion units included in a photoelectric conversion apparatus to be used independently or in combination.

By use of the coupling device in the above-described embodiments, one photoelectric conversion unit may be connected "in parallel" with another photoelectric conversion unit, or a group of a plurality photoelectric conversion units connected in series may be connected "in parallel" with another group of a plurality photoelectric conversion units connected in series. In addition, the coupling portion of the coupling device may be coupled with the coupling portion of each photoelectric conversion unit, and therefore, the coupling portion may be attached to, or detached from, the photoelectric conversion unit easily.

In the embodiment in which the photoelectric conversion device includes an electric power storage portion (secondary battery), each photoelectric conversion unit may be used independently as a usual compact battery, instead of a part of the photoelectric conversion apparatus. Each photoelectric conversion unit does not need to be compact, and may have a rectangular shape having a side having a length exceeding, for example, 10 cm.

INDUSTRIAL APPLICABILITY

According to the present disclosure, the photoelectric conversion units may be coupled or detached easily. Therefore, the photoelectric conversion apparatus has a high level of freedom regarding the shape and the output voltage, and is usable for various uses.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A photoelectric conversion apparatus, comprising a plurality of photoelectric conversion units located in an array, each including:

at least one photoelectric conversion device having a light incident surface; and a package accommodating the photoelectric conversion device and allowing light to be incident on the light incident surface of the photoelectric conversion device accommodated therein;

wherein:

the package includes:

a front surface having a window transmitting light;

a rear surface;

a side surface between the front surface and the rear surface;

a first coupling portion protruding from the side surface in a first direction parallel to the light incident surface of the accommodated photoelectric conversion device, the first coupling portion including a first terminal of a first polarity that is electrically connected with the photoelectric conversion device; and a second coupling portion recessed from the side surface in the first direction, the second coupling portion including a second terminal of a second polarity that is electrically connected with the photoelectric conversion device, the second polarity being opposite to the first polarity; and the plurality of photoelectric conversion devices are electrically connected with each other via the first terminal and the second terminal, wherein the photoelectric conversion device includes a photoelectric conversion portion and an electric power storage unit electrically connected with the photoelectric conversion portion.

2. The photoelectric conversion apparatus according to claim 1, wherein:

the plurality of photoelectric conversion units include first, second and third photoelectric conversion units arrayed in series along the first direction;

the first coupling unit of the second photoelectric conversion unit is coupled with the second coupling portion of the first photoelectric conversion unit, and the first terminal of the second photoelectric conversion unit is electrically connected with the second terminal of the first photoelectric conversion unit; and the second coupling unit of the second photoelectric conversion unit is coupled with the first coupling portion of the third photoelectric conversion unit, and the second terminal of the second photoelectric conversion unit is electrically connected with the first terminal of the third photoelectric conversion unit.

3. The photoelectric conversion apparatus according to claim 2, wherein:

the plurality of photoelectric conversion units each include:

a third coupling portion protruding from the side surface in a second direction different from the first direction, the second direction being parallel to the light incident surface; and a fourth coupling portion recessed from the side surface in the second direction;

the plurality of photoelectric conversion units include fourth, fifth and sixth photoelectric conversion units arrayed in in series in the first direction; and the third coupling portions of the fourth, fifth and sixth photoelectric conversion units are respectively coupled with the fourth coupling portions of the first, second and third photoelectric conversion units.

4. A photoelectric conversion unit, comprising:

at least one photoelectric conversion device having a light incident surface; and a package accommodating the photoelectric conversion device and allowing light to be incident on the light incident surface of the photoelectric conversion device accommodated therein;

wherein the package includes:

a front surface having a window transmitting light;

a rear surface;

a side surface between the front surface and the rear surface;

a first coupling portion protruding from the side surface in a first direction parallel to the light incident surface of the accommodated photoelectric conversion device, the first coupling portion including a first terminal of a first polarity that is electrically connected with the photoelectric conversion device; and a second coupling portion recessed from the side surface in the first direction, the second coupling portion including a second terminal of a second polarity that is electrically connected with the photoelectric conversion device, the second polarity being opposite to the first polarity, wherein the photoelectric conversion device includes a photoelectric conversion portion and an electric power storage unit electrically connected with the photoelectric conversion portion.

5. The photoelectric conversion unit according to claim 4, further comprising: a third coupling portion protruding from the side surface in a second direction different from the first direction, the second direction being parallel to the light incident surface; and a fourth coupling portion recessed from the side surface in the second direction.

6. The photoelectric conversion unit according to claim 4, wherein the photoelectric conversion portion is located on the side of the light incident surface, and the electric power storage portion is located on the side opposite to the light incident surface with respect to the photoelectric conversion unit.

7. The photoelectric conversion unit according to claim 4, further comprising an internal circuit electrically connecting the electric power storage portion and the photoelectric conversion portion with each other.

8. The photoelectric conversion unit according to claim 4, wherein the third coupling portion includes a third terminal, and the fourth coupling portion includes a fourth terminal.

9. The photoelectric conversion unit according to claim 4, wherein as seen in a direction normal to the light incident surface, the central position of the photoelectric conversion device is shifted in the first direction from the central position of the photoelectric conversion unit.

10. The photoelectric conversion unit according to claim 4, further comprising:

a first connection line connecting the photoelectric conversion device with the first terminal; and a second connection line connecting the photoelectric conversion device with the second terminal;

wherein a distance from a plane parallel to the light incident surface to the first connection line is different from a distance from the plane to the second connection line.

11. The photoelectric conversion unit according to claim 4, wherein a surface of the first coupling portion on the side of the rear surface and a surface of the second coupling portion on the side of the front surface are located substantially at the same plane.

12. The photoelectric conversion unit according to claim 4, wherein the package includes:

a first divided package including the front surface and the first and second coupling portions; and a second divided package including a surface having the photoelectric conversion device provided thereon, the second divided package being joined to a rear surface of the first divided package.

13. The photoelectric conversion unit according to claim 4, wherein the package includes:

a first divided package including a part of the front surface; and a second divided package including another part of the front surface, the second divided package being joined to a side surface of the first divided package.

14. A method for assembling a photoelectric conversion apparatus, comprising:

preparing the first and second photoelectric conversion units according to claim 4; and coupling the first coupling portion of the first photoelectric conversion unit and the second coupling portion of the second photoelectric conversion unit with each other.

15. The method according to claim 14, wherein the first photoelectric conversion device of the first photoelectric conversion unit and the second photoelectric conversion device of the second photoelectric conversion unit are electrically connected with each other in series.

16. A method for charging a photoelectric conversion apparatus, comprising:

preparing the photoelectric conversion apparatus according to claim 1; and irradiating the photoelectric conversion apparatus with light to generate power in the photoelectric conversion portion of the photoelectric conversion device and charging the electric power storage portion of the photoelectric conversion device with the power.

* * * * *